US011244862B2

(12) United States Patent
Yoshikawa et al.

(10) Patent No.: US 11,244,862 B2
(45) Date of Patent: Feb. 8, 2022

(54) METHOD FOR MANUFACTURING SEMICONDUCTOR DEVICES

(71) Applicant: Mitsubishi Electric Corporation, Tokyo (JP)

(72) Inventors: Kenji Yoshikawa, Tokyo (JP); Masato Negishi, Tokyo (JP); Masato Suzuki, Tokyo (JP); Tatsuro Yoshino, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 35 days.

(21) Appl. No.: 16/500,942

(22) PCT Filed: Apr. 10, 2018

(86) PCT No.: PCT/JP2018/015058
§ 371 (c)(1),
(2) Date: Oct. 4, 2019

(87) PCT Pub. No.: WO2018/198753
PCT Pub. Date: Nov. 1, 2018

(65) Prior Publication Data
US 2020/0111709 A1 Apr. 9, 2020

(30) Foreign Application Priority Data
Apr. 24, 2017 (JP) .............................. JP2017-085398

(51) Int. Cl.
*H01L 21/78* (2006.01)
(52) U.S. Cl.
CPC .................................. *H01L 21/78* (2013.01)
(58) Field of Classification Search
CPC ..... H01L 21/78; H01L 21/784; B28D 5/0005; B28D 5/0011
See application file for complete search history.

(56) References Cited

U.S. PATENT DOCUMENTS

| | | | |
|---|---|---|---|
| 2005/0196899 A1* | 9/2005 | Shimizu | B23K 26/364 438/113 |
| 2015/0243558 A1* | 8/2015 | Anselm | H01S 5/0202 438/462 |
| 2018/0145206 A1 | 5/2018 | Yoshikawa et al. | |

FOREIGN PATENT DOCUMENTS

| | | | |
|---|---|---|---|
| JP | 11251267 A | * | 9/1999 |
| JP | H11251267 A | | 9/1999 |

(Continued)

OTHER PUBLICATIONS

International Search Report (PCT/ISA/210) dated Jun. 19, 2018, by the Japan Patent Office as the International Searching Authority for International Application No. PCT/JP2018/015058.

(Continued)

*Primary Examiner* — Tuan A Hoang
(74) *Attorney, Agent, or Firm* — Buchanan Ingersoll & Rooney PC

(57) ABSTRACT

A method for manufacturing semiconductor devices includes: forming a plurality of semiconductor devices in a first region of a primary surface of a wafer; forming a plurality of cleave initiation portions in a second region of a primary surface different from the first region; and cleaving the wafer sequentially, using the plurality of cleave initiation portions as initiation points, starting from a cleave initiation portion that is relatively difficult to cleave among the plurality of cleave initiation portions. Forming the plurality of cleave initiation portions includes forming the plurality of first grooves by etching portions of the second region. Due to this, the yield and the manufacturing efficiency for semiconductor devices can be enhanced.

14 Claims, 21 Drawing Sheets

(56) References Cited

FOREIGN PATENT DOCUMENTS

| JP | 11274653 A | * | 10/1999 |
| JP | H11274653 A | | 10/1999 |
| JP | 2003258351 A | | 9/2003 |
| WO | 2017006902 A1 | | 1/2017 |

OTHER PUBLICATIONS

Written Opinion (PCT/ISA/237) dated Jun. 19, 2018, by the Japan Patent Office as the International Searching Authority for International Application No. PCT/JP2018/015058.
Office Action dated Jul. 29, 2020, issued in corresponding Chinese Patent Application No. 201880025305.4, 18 pages including 10 pages of English translation.

* cited by examiner

METHOD FOR MANUFACTURING SEMICONDUCTOR DEVICES

TECHNICAL FIELD

The present invention relates to a method for manufacturing semiconductor devices.

BACKGROUND ART

Japanese Patent Laying-Open No. H11-274653 (PTL 1) discloses a method for cleaving a wafer. The method for cleaving a wafer disclosed in PTL 1 includes scribing portions of the wafer to form multiple scratches having different lengths, and cleaving the wafer along with the scratches sequentially, starting from a relatively long scratch to a relatively short scratch.

CITATION LIST

Patent Literature

PTL 1: Japanese Patent Laying-Open No. H11-274653

SUMMARY OF INVENTION

Technical Problem

When a wafer is cloven according to the method for cleaving a wafer disclosed in PTL 1, the wafer size decreases with an increase in the number of times the wafer is cloven, ending up with reduction in the bending stress of the wafer that acts on scratches. The lengths of scratches, at which the cleaving is initiated, also decreases with an increase in the number of times the wafer is cloven. Due to this, cleaving the wafer becomes more difficult with an increase in the number of times the wafer is cloven, and the wafer may not be cloven. Due to this, the yield and the manufacturing efficiency for semiconductor devices decrease. Furthermore, when forming multiple scratches in a wafer by scribing it, cracks can be developed in the wafer from the scratches. The cracks extend in random directions. Due to this, the directions of cleavages of the wafer are offset from intended directions, ending up with a reduction in yield for the semiconductor devices.

The present invention is made in view of the above problem, and an object of the present invention is to provide a method for manufacturing semiconductor devices which can enhance the yield and manufacturing efficiency for semiconductor devices.

Solution to Problem

A method for manufacturing semiconductor devices according to the present invention includes forming a plurality of semiconductor devices in a first region of a primary surface of a wafer. The plurality of semiconductor devices are arranged along a first direction and a second direction intersecting with the first direction. The method for manufacturing semiconductor devices according to the present invention further includes forming a plurality of cleave initiation portions in a second region of a primary surface different from the first region. The plurality of cleave initiation portions are arranged along the second direction. The plurality of cleave initiation portions have different levels of difficulty in being cloven. Forming the plurality of cleave initiation portions includes forming a plurality of first grooves by etching portions of the second region. The plurality of first grooves extend along the first direction. The method for manufacturing semiconductor devices according to the present invention includes cleaving a wafer sequentially, using the plurality of cleave initiation portions as initiation points, starting from a cleave initiation portion that is relatively difficult to cleave among the plurality of cleave initiation portions.

Advantageous Effects of Invention

In the method for manufacturing semiconductor devices according to the present invention, as the number of times a wafer is cloven increases, a cleave initiation portion that is relatively easier to cleave can be used to cleave the wafer. Due to this, a wafer can be cloven in a stable manner, even when the wafer reduces in size and the bending stress, which acts on a cleave initiation portion when cleaving the wafer, reduces with an increase in the number of times the wafer is cloven. Moreover, the wafer can be prevented from developing cracks that extend in random directions. The wafer can be cloven in a stable manner. According to the method for manufacturing semiconductor devices of the present embodiment, the yield and the manufacturing efficiency for semiconductor devices can be enhanced.

DESCRIPTION OF EMBODIMENTS

Hereinafter, embodiments according to the present invention will be described. Note that like reference numbers refer to like configurations, and the descriptions thereof will not be repeated.

Embodiment 1

Referring to FIGS. 1 through 8, a method for manufacturing semiconductor devices 12 according to Embodiment 1 will be described.

Figure 1:
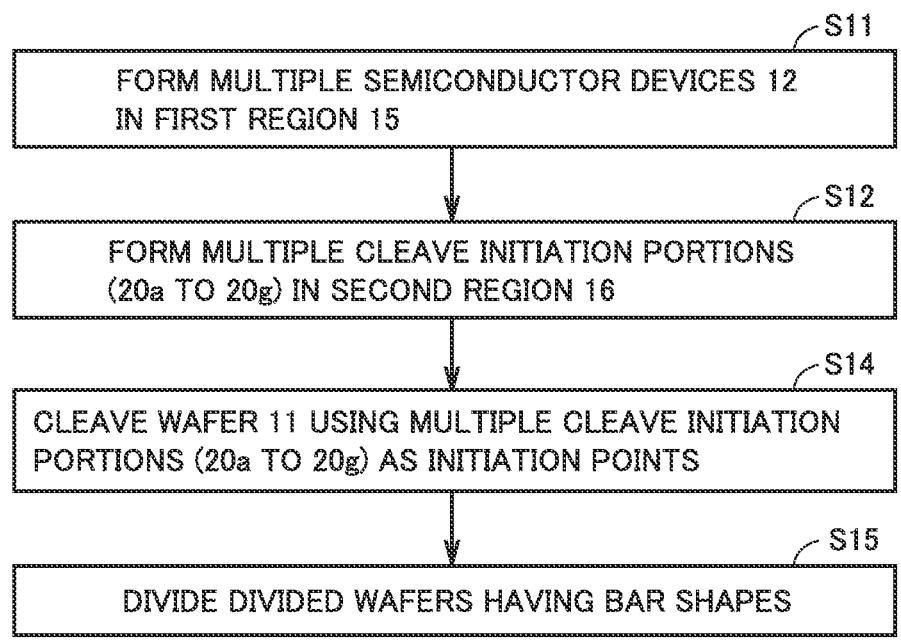
FIG. 1 is a flowchart showing a method for manufacturing semiconductor devices according to Embodiment 1 of the present invention.
Figure 2:
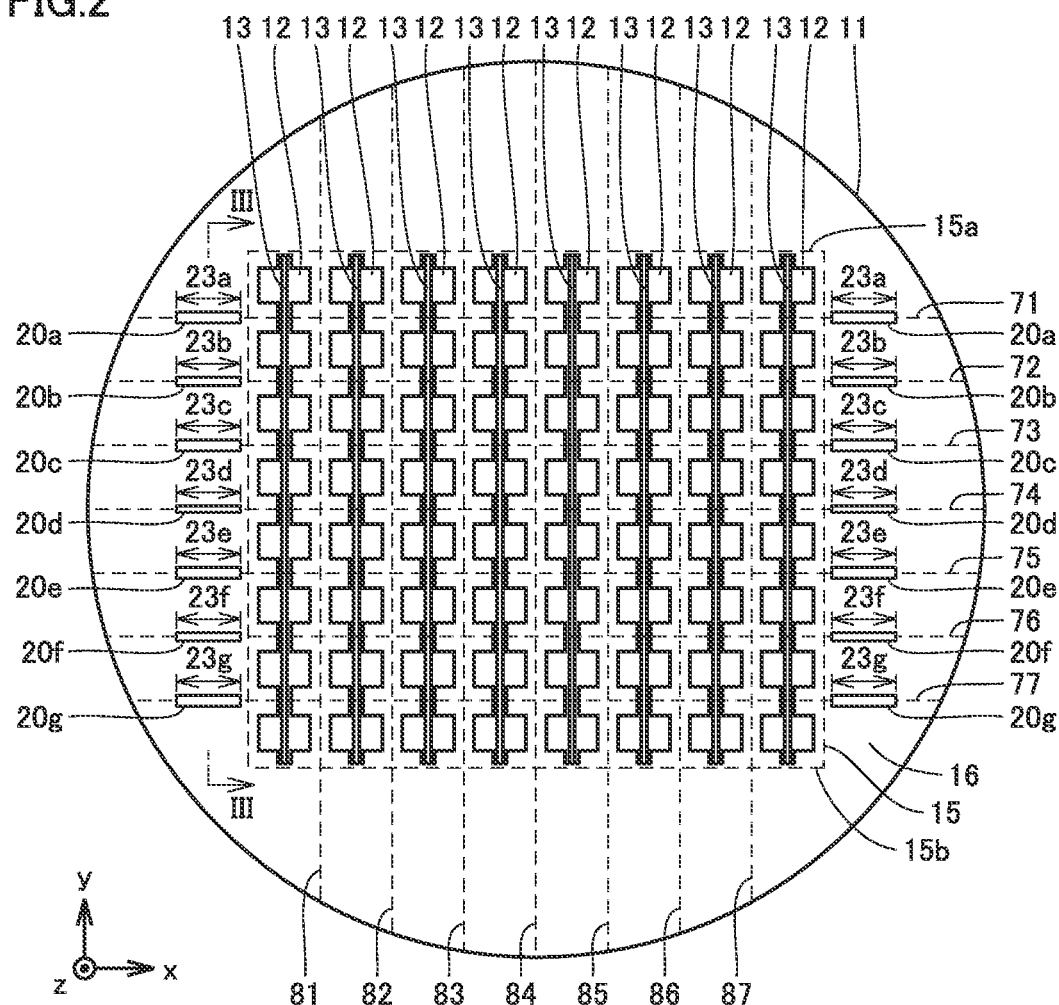
FIG. 2 is a schematic plan view showing one process included in the method for manufacturing semiconductor devices according to Embodiment 1 of the present invention.

Referring to FIGS. 1 and 2, the method for manufacturing semiconductor devices 12 according to the present embodiment includes forming (S11) multiple semiconductor devices 12 in a first region 15 of a primary surface 11a of a wafer 11. Multiple semiconductor devices 12 are arranged along a first direction (e.g., x direction) and a second direction (e.g., y direction) intersecting with the first direction. Particularly, the second direction may be orthogonal to the first direction. The material of wafer 11 may be, but not particularly limited to, indium phosphide (InP), gallium arsenide (GaAs), or gallium nitride (GaN).

Multiple semiconductor devices 12 each may include a semiconductor layer, an insulating layer, and an electrode. For example, the semiconductor layer, the insulating layer, and the electrode may be piled up on primary surface 11a of wafer 11 by sputtering, vacuum deposition, or chemical vapor deposition (CVD) to form multiple semiconductor devices 12. In the present embodiment, semiconductor device 12 is a semiconductor laser, such as a waveguide semiconductor laser, and includes an active region 13. Light is emitted from active region 13 of each of multiple semiconductor devices 12 that is obtained by dividing multiple semiconductor devices 12. A pair of cleave planes are formed for each of multiple semiconductor devices 12 by cleaving (S14) wafer 11. The pair of cleave planes may serve as a resonator for the semiconductor laser. Semiconductor device 12 may be a semiconductor laser which has a short resonator length. The short resonator length may be 300 μm or less, or 250 μm or less. The short resonator length may be 100 μm or greater, or 150 μm or greater. Semiconductor device 12 is not limited to a semiconductor laser, and may be, for example, a light-emitting diode, a transistor, or a diode.

Referring to FIGS. 1 through 6, the method for manufacturing semiconductor devices 12 according to the present embodiment includes forming (S12) multiple cleave initiation portions (20a to 20g) in a second region 16 of primary surface 11a different from first region 15. Particularly, multiple cleave initiation portions (20a to 20g) may be multiple first grooves 20a to 20g. Multiple cleave initiation portions (20a to 20g) are arranged along the second direction. Multiple first grooves 20a to 20g are arranged along the second direction. Multiple cleave initiation portions (20a to 20g) each extend along the first direction. Multiple first grooves 20a to 20g each extend along the first direction. The number of multiple first grooves 20a to 20g arranged along the second direction is not limited to seven pairs.

Multiple cleave initiation portions (20a to 20g) are arranged on multiple division reference lines 71 to 77, respectively. Multiple first grooves 20a to 20g are arranged on multiple division reference lines 71 to 77, respectively. Herein, multiple division reference lines 71 to 77 mean reference lines for dividing wafer 11. Specifically, first groove 20a is arranged on division reference line 71. First groove 20b is arranged on division reference line 72. First groove 20c is arranged on division reference line 73. First groove 20d is arranged on division reference line 74. First groove 20e is arranged on division reference line 75. First groove 20f is arranged on division reference line 76. First groove 20g is arranged on division reference line 77. Multiple division reference lines 71 to 77 may be in parallel with the first direction. Multiple division reference lines 71 to 77 and the first direction may be in parallel with the cleave planes of wafer 11.

Multiple cleave initiation portions (20a to 20g) may be arranged to one side and the other side of first region 15 in the first direction. Multiple first grooves 20a to 20g may be arranged to one side and the other side of first region 15 in the first direction. First region 15 is located between multiple first grooves 20a to 20g arranged to the one side of first region 15 and multiple first grooves 20a to 20g arranged to the other side, in the first direction. Multiple first grooves 20a to 20g arranged to the one side of first region 15 may respectively be apart from first region 15 by a first equidistant. Multiple first grooves 20a to 20g arranged to the other side of first region 15 may respectively be apart from first region 15 by a second equidistant. The second equidistant may be equal to the first equidistant.

Multiple first grooves 20a to 20g arranged to the one side of first region 15 and multiple first grooves 20a to 20g arranged to the other side of first region 15 are arranged along the first direction. Multiple first grooves 20a to 20g arranged to the one side of first region 15 and multiple first grooves 20a to 20g arranged to the other side of first region 15 are arranged on the same division reference lines 71 to 77, respectively. Specifically, first groove 20a arranged to the one side of first region 15 and first groove 20a arranged to the other side of first region 15 are arranged on division reference line 71. First groove 20b arranged to the one side of first region 15 and first groove 20b arranged to the other side of first region 15 are arranged on division reference line 72. First groove 20c arranged to the one side of first region 15 and first groove 20c arranged to the other side of first region 15 are arranged on division reference line 73. First groove 20d arranged to the one side of first region 15 and first groove 20d arranged to the other side of first region 15 are arranged on division reference line 74. First groove 20e arranged to the one side of first region 15 and first groove 20e arranged to the other side of first region 15 are arranged on division reference line 75. First groove 20f arranged to the one side of first region 15 and first groove 20f arranged to the other side of first region 15 are arranged on division reference line 76. First groove 20g arranged to the one side of first region 15 and first groove 20g arranged to the other side of first region 15 are arranged on division reference line 77.

Multiple cleave initiation portions (20a to 20g) may be arranged only to the one side of first region 15 in the first direction, or may be arranged only to the other side of first region 15 in the first direction. The area of second region 16 of wafer 11 in which multiple first grooves 20a to 20g are formed can decrease, which can increase the area of first region 15 in which multiple semiconductor devices 12 are formed. Due to this, the yield for semiconductor devices 12 can be enhanced.

Multiple cleave initiation portions (20a to 20g) have different levels of difficulty in being cloven. Particularly, at least one of first depths 22a to 22g and first lengths 23a to 23g of multiple first grooves 20a to 20g are different. First depths 22a to 22g are the lengths of multiple first grooves 20a to 20g in a third direction (e.g., z direction) perpendicular to primary surface 11a. First lengths 23a to 23g are the lengths of multiple first grooves 20a to 20g in the first direction. First grooves 20a to 20g which have relatively less first depths 22a to 22g are more difficult to cleave than first grooves 20a to 20g which have relatively great first depths 22a to 22g. First grooves 20a to 20g which have relatively less first lengths 23a to 23g are more difficult to cleave than first grooves 20a to 20g which have relatively great first lengths 23a to 23g. In the present embodiment, first depths 22a to 22g of multiple first grooves 20a to 20g are different. First depths 22a to 22g of multiple first grooves 20a to 20g may be, for example, 5 μm or greater and 50 μm or less. Multiple first grooves 20a to 20g having first depths 22a to 22g of 5 μm or greater can serve as multiple cleave initiation portions (20a to 20g), respectively. Multiple first grooves 20a to 20g having first depths 22a to 22g of 50 μm or less can prevent wafer 11 from shattering during wafer processing.

Particularly, first groove 20d is arranged on division reference line 74 located halfway between the one end portion 15a of first region 15 in the second direction and the other end portion 15b of first region 15 in the second direction. First groove 20b is arranged on division reference line 72 that is located halfway between one end portion 15a of first region 15 and division reference line 74 in the second direction. First groove 20f is arranged on division reference line 76 that is located halfway between the other end portion 15b of first region 15 and division reference line 74 in the second direction. First groove 20a is arranged on division reference line 71 that is located halfway between one end portion 15a of first region 15 and division reference line 72 in the second direction. First groove 20c is arranged on division reference line 73 that is located halfway between division reference line 72 and division reference line 74. First groove 20e is arranged on division reference line 75 that is located halfway between division reference line 76 and division reference line 74. First groove 20g is arranged on division reference line 77 that is located halfway between the other end portion 15b of first region 15 and division reference line 76 in the second direction.

At least one of first depth 22d and first length 23d of first groove 20d is less than at least one of first depths 22a to 22c, 22e to 22g and first lengths 23a to 23c, 23e to 23g of first grooves 20a to 20c, 20e to 20g. In the present embodiment, first depth 22d of first groove 20d is less than first depths 22a to 22c, 22e to 22g of first grooves 20a to 20c, 20e to 20g. First groove 20d is more difficult to cleave than first grooves 20a to 20c, 20e to 20g. At least one of first depths 22b, 22f and first lengths 23b, 23f of first grooves 20b, 20f are less than at least one of first depths 22a, 22c, 22e, 22g and first lengths 23a, 23c, 23e, 23g of first grooves 20a, 20c, 20e, 20g. In the present embodiment, first depths 22b, 22f of first grooves 20b, 20f are less than first depths 22a, 22c, 22e, 22g of first grooves 20a, 20c, 20e, 20g. First grooves 20b, 20f are easier to cleave than first groove 20d, and more difficult to cleave than first grooves 20a, 20c, 20e, 20g. First grooves 20a, 20c, 20e, 20g are easier to cleave than first grooves 20b, 20d, 20f, respectively. First grooves 20b, 20f may have first depths 22b, 22d which are an equal depth. First grooves 20a, 20c, 20e, 20g may have first depths 22a, 22c, 22e, 22g which are an equal depth.

First lengths 23a to 23g of multiple first grooves 20a to 20g may be the same. First lengths 23a to 23g of multiple first grooves 20a to 20g may be 500 μm or greater, at least 1% of the diameter of wafer 11, or at least 2% of the diameter of wafer 11. First lengths 23a to 23g of multiple first grooves 20a to 20g may be 10% or less or 5% or less of the diameter of wafer 11.

First widths 21a to 21g of multiple first grooves 20a to 20g may be the same. First widths 21a to 21g of multiple first grooves 20a to 20g may be different. Specifically, first width 21d of first groove 20d may be less than first widths 21a to 21c, 21e to 21g of first grooves 20a to 20c, 20e to 20g. First widths 21b, 21f of first grooves 20b, 20f may be less than first widths 21a, 21c, 21e, 21g of first grooves 20a, 20c, 20e, 20g. First grooves 20b, 20f may have first widths 21b, 21d which are an equal width. First grooves 20a, 20c, 20e, 20g may have first widths 21a, 21c, 21e, 21g which are an equal width.

Figure 3:
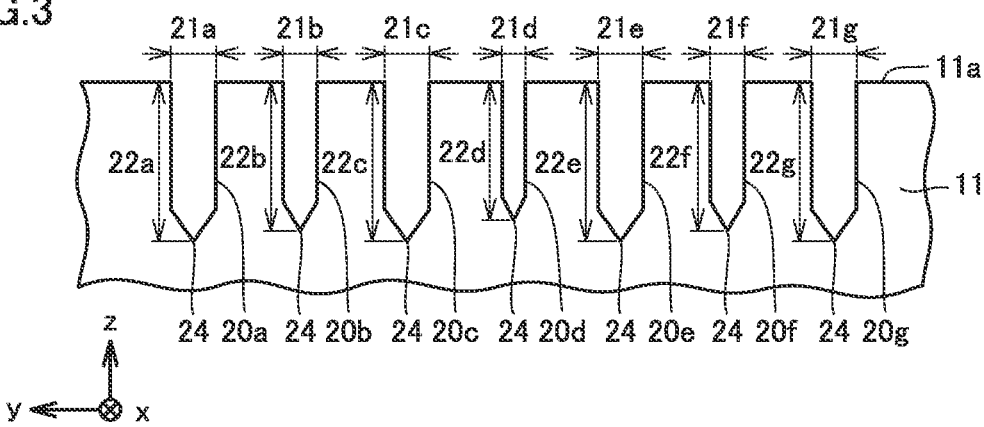
FIG. 3 is an enlarged schematic partial cross-sectional view of one process included in the method for manufacturing semiconductor devices according to Embodiment 1 of the present invention, taken along a section line shown in FIG. 2.
Figure 4:
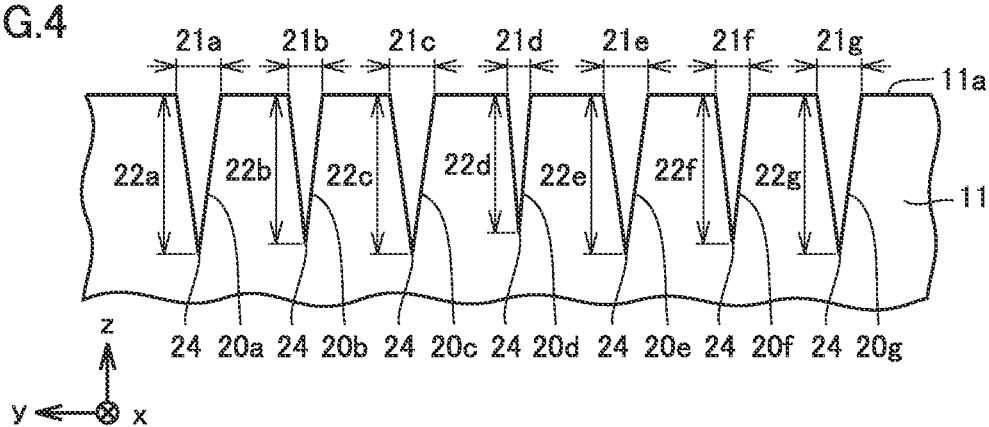
FIG. 4 is an enlarged schematic partial cross-sectional view showing one process included in a method for manufacturing semiconductor devices according to a variation of Embodiment 1 of the present invention.
Figure 5:
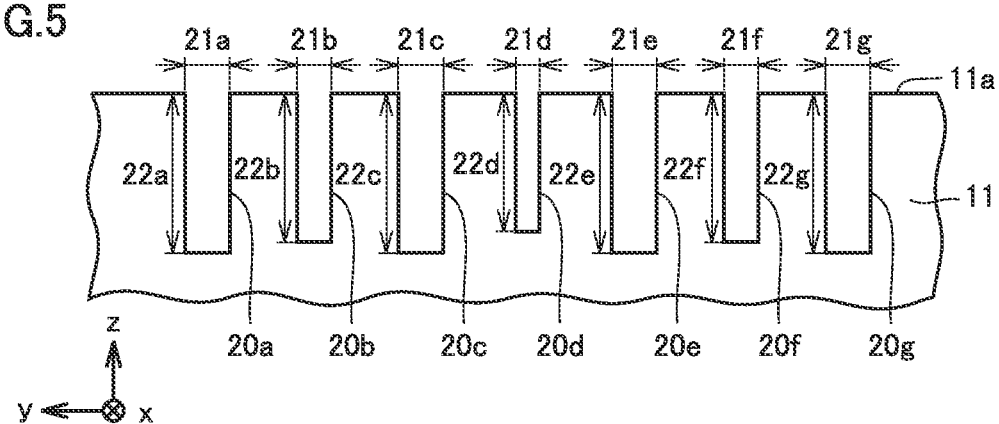
FIG. 5 is an enlarged schematic partial cross-sectional view showing one process included in the method for manufacturing semiconductor devices according to the variation of Embodiment 1 of the present invention.

As shown in FIG. 3, in the present embodiment, multiple first grooves 20a to 20g each may include a V-shaped bottom portion 24 in a cross section orthogonal to the first direction. Multiple first grooves 20a to 20g each may include a side face extending substantially perpendicular to primary surface 11a of wafer 11, and a V-shaped bottom portion 24 connected to the side face. As shown in FIG. 4, multiple first grooves 20a to 20g each may include a V-shaped bottom portion 24 and a side face inclined from primary surface 11a of wafer 11 to bottom portion 24. As shown in FIG. 5, multiple first grooves 20a to 20g each may include a flat bottom portion. Multiple first grooves 20a to 20g each may include a side face extending substantially perpendicular to primary surface 11a of wafer 11 and a bottom portion connected to the side face and extending substantially in parallel with primary surface 11a of wafer 11.

Referring to FIGS. 1 through 6, forming multiple cleave initiation portions (20a to 20g) includes forming multiple first grooves 20a to 20g by etching portions of second region 16. For example, multiple first grooves 20a to 20g may be formed in second region 16 of wafer 11 by dry etching the portions of second region 16 of wafer 11. Wafer 11 may be etched by dry etching such as reactive ion etching (RIE) or inductively coupled plasma (ICP) etching, for example. Multiple first grooves 20a to 20g may be formed in second region 16 of wafer 11 by wet etching the portions of second region 16 of wafer 11. Wafer 11 may be etched using an etchant including at least one of hydrogen fluoride (HF), potassium hydroxide (KOH), hydrochloric acid (HCl), hydrogen bromide (HBr), sulfuric acid ($H_2SO_4$), and nitric acid ($HNO_3$), for example. Multiple first grooves 20a to 20g may be formed in second region 16 of wafer 11 by dry etching and then wet etching the portions of second region 16 of wafer 11.

Figure 6:
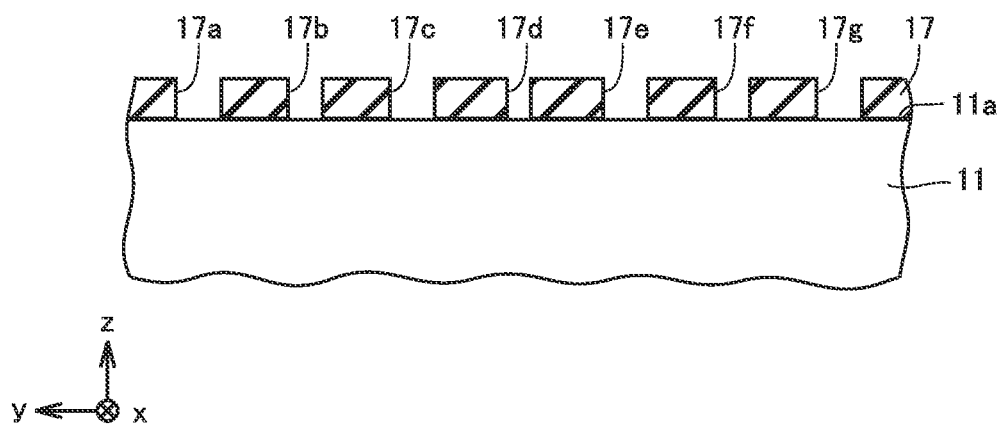
FIG. 6 is an enlarged schematic partial cross-sectional view showing one process included in the method for manufacturing semiconductor devices according to Embodiment 1 of the present invention.

Specifically, as shown in FIG. 6, a mask 17 having multiple openings 17a to 17g is formed on primary surface 11a of wafer 11. Mask 17 is, but not limited to, a $SiO_2$ film. Multiple openings 17a to 17g may have the same width. The widths of multiple openings 17a to 17g are the lengths of multiple openings 17a to 17g in the first direction. Multiple openings 17a to 17g may have different widths. Specifically, the width of opening 17d of mask 17 may be less than the widths of openings 17a, 17c, 17e, 17g of mask 17. The widths of openings 17b, 17f of mask 17 may be less than the widths of openings 17a, 17c, 17e, 17g of mask 17. Openings 17b, 17f of mask 17 may have an equal width. Openings 17a, 17c, 17e, 17g of mask 17 may have an equal width.

Multiple first grooves 20a to 20g are formed by etching, by dry etching, the portions of wafer 11 which are exposed from multiple openings 17a to 17g of mask 17. The greater the widths of multiple openings 17a to 17g of mask 17, the greater the etching rate of wafer 11, and the deeper the depths of first grooves 20a to 20g formed. Specifically, since the widths of openings 17b, 17f of mask 17 are greater than the width of opening 17d of mask 17, first depths 22b, 22f of first grooves 20b, 20f are greater than first depth 22d of first groove 20d. Since the widths of openings 17a, 17c, 17e, 17g of mask 17 are greater than the widths of openings 17b, 17f of mask 17, first depths 22a, 22c, 22e, 22g of first grooves 20a, 20c, 20e, 20g are greater than first depths 22b, 22f of first grooves 20b, 20f. In this way, multiple first grooves 20a to 20g that have different first depths 22a to 22g can be formed at once.

Wafer 11 is then further etched by wet-etching. Multiple first grooves 20a to 20g which include V-shaped bottom portion 24 may be formed by etching wafer 11 by using an etchant whose etching rate depends on a plane direction. In this way, multiple first grooves 20a to 20g shown in FIG. 3 can be formed.

The method for manufacturing semiconductor devices 12 according to the present embodiment includes cleaving wafer 11 sequentially, using (S14) multiple cleave initiation portions (20a to 20g) as initiation points, starting from a cleave initiation portion (e.g., cleave initiation portion (20d)) that is relatively difficult to cleave among multiple cleave initiation portions (20a to 20g). Particularly, multiple first grooves 20a to 20g are used as initiation points to cleave wafer 11 sequentially, starting from a first groove (e.g., first groove 20d) at least one of first depth 22a to 22g and first length 23a to 23g of which is relatively small among multiple first grooves 20a to 20g. Multiple first grooves 20a to 20g are used as initiation points to cleave wafer 11, in the order of at least one of first depths 22a to 22g and first lengths 23a to 23g, starting from a first groove (e.g., first groove 20d) at least one of first depth 22a to 22g and first length 23a to 23g of which is relatively small among multiple first grooves 20a to 20g to a first groove (e.g., first grooves 20a, 20c, 20e, 20g) at least one of first depth 22a to 22g and first length 23a to 23g of which is relatively great among multiple first grooves 20a to 20g. Cleaving (S14) wafer 11 includes: cleaving wafer 11 at the center portion of wafer 11 in the second direction to obtain two divided wafers 11; and cleaving, at least once, the divided wafers 11 at the center portions of the divided wafers 11 in the second direction.

Figure 7:
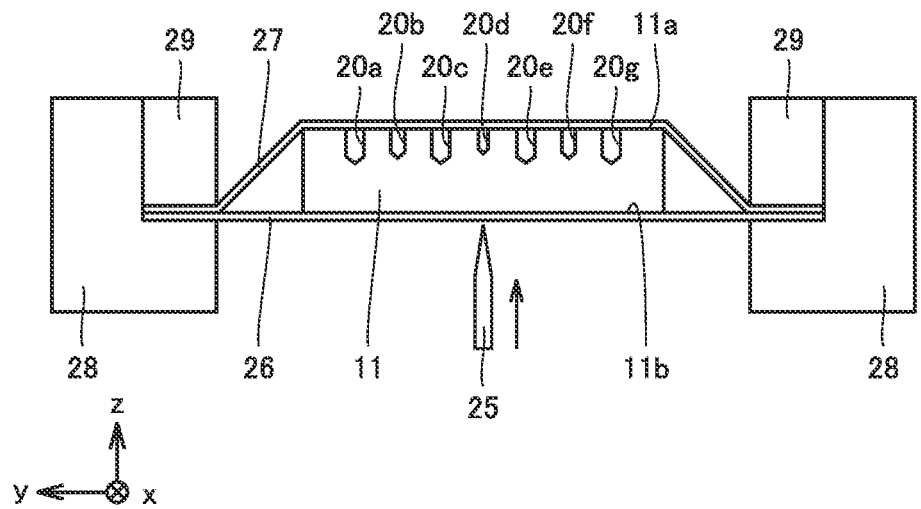
FIG. 7 is a schematic cross-sectional view showing one process included in the method for manufacturing semiconductor devices according to Embodiment 1 of the present invention.

Specifically, as shown in FIG. 7, a back surface 11b of wafer 11, opposite the primary surface 11a, is applied to a pressure sensitive adhesive sheet 26. Primary surface 11a of wafer 11 is covered with a cover sheet 27. Both ends of pressure sensitive adhesive sheet 26 and both ends of cover sheet 27 are supported by a base 28. A holder 29 presses the both ends of pressure sensitive adhesive sheet 26 and the both ends of cover sheet 27 against base 28. In this way, the both ends of pressure sensitive adhesive sheet 26 and the both ends of cover sheet 27 are secured to base 28, using holder 29.

Figure 8:
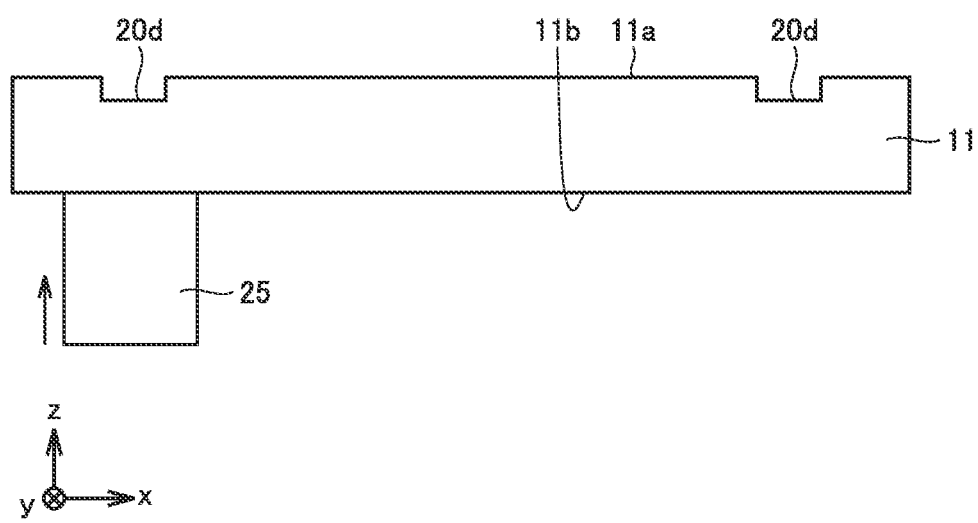
FIG. 8 is a schematic cross-sectional view showing one process included in the method for manufacturing semiconductor devices according to Embodiment 1 of the present invention.

Initially, wafer 11 is cloven in the center portion of wafer 11 in the second direction, resulting in two divided wafers. Specifically, wafer 11 is cloven along division reference line 74. Referring to FIGS. 7 and 8, a blade 25 is arranged, facing, with pressure sensitive adhesive sheet 26 inbetween, first groove 20d that has a least first depth 22d and is arranged to one side of first region 15. Blade 25 is not arranged below first groove 20d that is arranged to the other side of first region 15. Blade 25 is arranged in parallel with division reference line 74. Blade 25 is pushed against pressure sensitive adhesive sheet 26 to apply a load to wafer 11 from back surface 11b of wafer 11 toward primary surface 11a. Using blade 25, the load is applied only to first groove 20d that is arranged to the one side of first region 15. The load is not applied to first groove 20d that is arranged to the other side of first region 15. In this way, first groove 20d that is arranged to the one side of first region 15 is used as an initiation point to cleave wafer 11 along division reference line 74.

Next, divided wafers 11 are cloven at the center portions of the divided wafers 11 in the second direction. Wafers 11, divided along division reference line 74, are cloven along division reference lines 72, 76. Wafer 11 may be cloven along division reference line 72 before cleaving wafer 11 along division reference line 76 or after cleaving wafer 11 along division reference line 76. Blade 25 is arranged, facing, with pressure sensitive adhesive sheet 26 inbetween, first grooves 20b, 20f arranged to the one side of first region 15 and having first depths 22b, 22f that are the least depth after that of first groove 20d. Blade 25 is arranged in parallel with division reference lines 72, 76. Blade 25 is pushed against pressure sensitive adhesive sheet 26 to apply a load to wafer 11 from back surface 11b of wafer 11 toward primary surface 11a. In this way, first grooves 20b, 20f that are arranged to the one side of first region 15 are used as initiation points to cleave wafers 11 along division reference lines 72, 76.

Next, divided wafers 11 are further cloven at the center portions of divided wafers 11 in the second direction. Wafers 11, divided along division reference lines 72, 74, 76, are cloven along division reference lines 71, 73, 75, 77. Cleaving wafer 11 along division reference line 71, cleaving wafer 11 along division reference line 73, cleaving wafer 11 along division reference line 75, and cleaving wafer 11 along division reference line 77 may be carried out in any order. Blade 25 is arranged, facing, with pressure sensitive adhesive sheet 26 inbetween, first grooves 20a, 20c, 20e, 20g arranged to the one side of first region 15 and having the least first depths 22a, 22c, 22e, 22g after those of first grooves 20b, 20f. Blade 25 is arranged in parallel with division reference lines 71, 73, 75, 77. Blade 25 is pushed against pressure sensitive adhesive sheet 26 to apply a load to wafer 11 from back surface 11b of wafer 11 toward primary surface 11a. In this way, first grooves 20a, 20c, 20e, 20g that are arranged to the one side of first region 15 are used as initiation points to cleave wafers 11 along division reference lines 71, 73, 75, 77.

The method for manufacturing semiconductor devices 12 according to the present embodiment may further include dividing (S15) the divided wafers 11 having bar shapes, along division reference lines 81 to 87. Division reference lines 81 to 87 intersect with division reference lines 71 to 77. The divided wafer 11 having bar shapes are divided, thereby dividing wafers 11 into multiple semiconductor devices 12. Multiple semiconductor devices 12 are removed from pressure sensitive adhesive sheet 26. In this way, multiple semiconductor devices 12 can be manufactured.

Advantages effects of the method for manufacturing semiconductor devices 12 according to the present embodiment will be described.

The method for manufacturing semiconductor devices 12 according to the present embodiment includes forming (S11) multiple semiconductor devices 12 in first region 15 of primary surface 11a of wafer 11. Multiple semiconductor devices 12 are arranged along the first direction and the second direction intersecting with the first direction. The method for manufacturing semiconductor devices 12 according to the present embodiment further includes forming (S12) multiple cleave initiation portions (20a to 20g) in second region 16 of primary surface 11a different from first region 15. Multiple cleave initiation portions (20a to 20g) are arranged along the second direction. Multiple cleave initiation portions (20a to 20g) have different levels of difficulty in being cloven. Forming multiple cleave initiation portions (20a to 20g) includes forming multiple first grooves 20a to 20g by etching portions of second region 16. Multiple first grooves 20a to 20g each extend along the first direction. The method for manufacturing semiconductor devices 12 according to the present embodiment includes cleaving wafer 11 sequentially, using multiple cleave initiation portions (20a to 20g) as initiation points, starting from a cleave initiation portion (e.g., cleave initiation portion (20d)) that is relatively difficult to cleave among multiple cleave initiation portions (20a to 20g) (S14).

In the method for manufacturing semiconductor devices 12 according to the present embodiment, as the number of times the wafer 11 is cloven increases, a cleave initiation portion (20a to 20g) that is relatively easier to cleave is used to cleave wafer 11. Due to this, wafer 11 is cloven in a stable manner, even when wafer 11 reduces in size and the bending stress, which acts on cleave initiation portions (20a to 20g)

when cleaving wafer 11, reduces with an increase in the number of times the wafer 11 is cloven. According to the method for manufacturing semiconductor devices 12 of the present embodiment, the yield and the manufacturing efficiency for semiconductor devices 12 can be enhanced.

Moreover, in Comparative Example in which scribing wafer 11 forms multiple scratches in wafer 11, cracks are developed in wafer 11. However, multiple first grooves 20a to 20g according to the present embodiment that are formed by etching wafer 11 can prevent wafer 11 from developing cracks that extend in various directions. Wafer 11 can be cloven in a stable manner, along multiple division reference lines 71 to 77. According to the method for manufacturing semiconductor devices 12 of the present embodiment, the yield for semiconductor devices 12 can be enhanced.

Furthermore, in the method for manufacturing semiconductor devices 12 according to the present embodiment, multiple first grooves 20a to 20g included in multiple cleave initiation portions (20a to 20g) are formed by etching portions of second region 16 of wafer 11. Compared with multiple scratches according to Comparative Example that are formed by scribing wafer 11, multiple first grooves 20a to 20g according to the present embodiment that are formed by etching wafer 11 have less variation in first lengths 23a to 23g, first depths 22a to 22g, and first widths 21a to 21g. There is almost no need to consider variations in first lengths 23a to 23g, first depths 22a to 22g, and first widths 21a to 21g of multiple first grooves 20a to 20g when determining first lengths 23a to 23g, first depths 22a to 22g, and first widths 21a to 21g of multiple first grooves 20a to 20g.

Due to this, first widths 21a to 21g and first lengths 23a to 23g of multiple first grooves 20a to 20g formed by the etching can be less as compared to the widths and lengths of multiple scratches that are formed by scribing a wafer. The area of second region 16 of wafer 11 in which multiple first grooves 20a to 20g are formed can be reduced, which can increase the area of first region 15 in which multiple semiconductor devices 12 are formed. Moreover, spacing between multiple first grooves 20a to 20g formed by the etching can be less, as compared to spacing between multiple first grooves 20a to 20g formed by scribing a wafer. Each of multiple semiconductor devices 12 formed in first region 15 can be reduced in size, which can increase the number of multiple semiconductor devices 12 formed per wafer 11. According to the method for manufacturing semiconductor devices 12 of the present embodiment, the yield and the manufacturing efficiency for semiconductor devices 12 can be enhanced.

In the method for manufacturing semiconductor devices 12 according to the present embodiment, multiple cleave initiation portions (20a to 20g) may be multiple first grooves 20a to 20g. At least one of first depths 22a to 22g and first lengths 23a to 23g of multiple first grooves 20a to 20g are different. First depths 22a to 22g are the lengths of multiple first grooves 20a to 20g in the third direction perpendicular to primary surface 11a. First lengths 23a to 23g are the lengths of multiple first grooves 20a to 20g in the first direction. Cleaving wafer 11 includes cleaving wafer 11 sequentially, using multiple first grooves 20a to 20g as initiation points, starting from a first groove (e.g., first groove 20d) at least one of first depth 22a to 22g and first length 23a to 23g of which is relatively small among multiple first grooves 20a to 20g. According to the method for manufacturing semiconductor devices 12 of the present embodiment, the yield and the manufacturing efficiency for semiconductor devices 12 can be enhanced.

In the method for manufacturing semiconductor devices 12 according to the present embodiment, cleaving (S14) wafer 11 includes cleaving wafer 11 at the center portion of wafer 11 in the second direction to obtain two divided wafers 11, and cleaving, at least once, the divided wafers 11 at the center portions of the divided wafers 11 in the second direction. Therefore, when cleaving wafer 11, bending stresses that are symmetrical in the second direction are applied to each of multiple cleave initiation portions (20a to 20g). According to the method for manufacturing semiconductor devices 12 of the present embodiment, the yield and the manufacturing efficiency for semiconductor devices 12 can be enhanced.

In the method for manufacturing semiconductor devices 12 according to the present embodiment, multiple first grooves 20a to 20g each may include a V-shaped bottom portion 24 in a cross section orthogonal to the first direction. When cleaving wafer 11 in which multiple first grooves 20a to 20g including V-shaped bottom portions 24 are formed, the stress is concentrated at the tips of V-shaped bottom portions 24. Wafer 11 is easiest to cleave in the center of each of multiple first grooves 20a to 20g in the second direction. Multiple first grooves 20a to 20g which include V-shaped bottom portions 24 allows wafer 11 to be divided along multiple division reference lines 71 to 77 with greater precision. According to the method for manufacturing semiconductor devices 12 of the present embodiment, the yield and the manufacturing efficiency for semiconductor devices 12 can be enhanced.

In the method for manufacturing semiconductor devices 12 according to the present embodiment, multiple cleave initiation portions (20a to 20g) may be arranged to the one side and the other side of first region 15 in the first direction. Multiple first grooves 20a to 20g arranged to the one side of first region 15 and multiple first grooves 20a to 20g arranged to the other side of first region 15 are arranged along the first direction. Due to this, wafer 11 can be divided along multiple division reference lines 71 to 77 with greater precision. According to the method for manufacturing semiconductor devices 12 of the present embodiment, the yield for semiconductor devices 12 can be enhanced.

Embodiment 2

Referring to FIGS. 9 through 12, a method for manufacturing semiconductor devices 12 according to Embodiment 2 will be described. The method for manufacturing semiconductor devices 12 according to the present embodiment includes the same processes as those included in the method for manufacturing semiconductor devices 12 according to Embodiment 1, except primarily the differences below.

Figure 9:
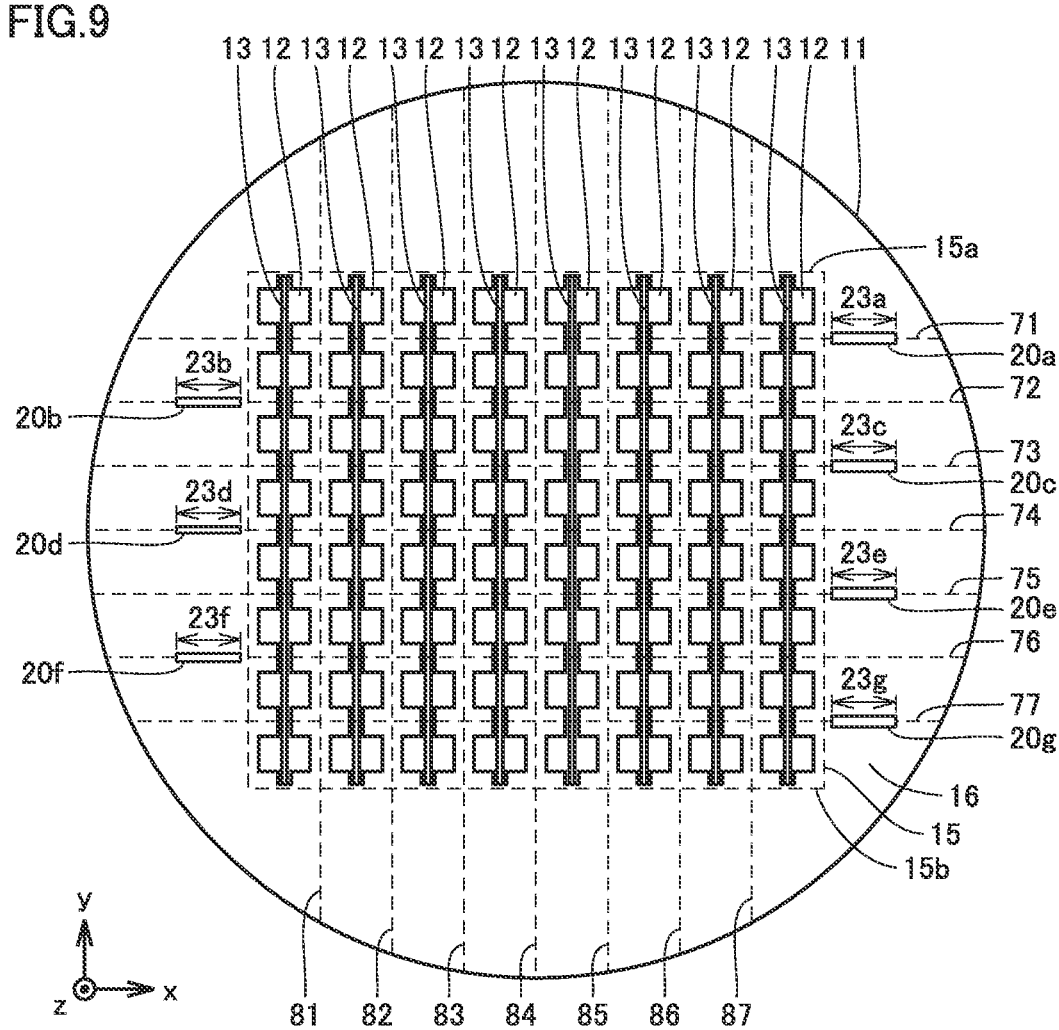
FIG. 9 is a schematic plan view showing one process included in a method for manufacturing semiconductor devices according to Embodiment 2 of the present invention.

In the method for manufacturing semiconductor devices 12 according to the present embodiment, multiple cleave initiation portions (20a to 20g) are arranged to the one side and the other side of first region 15 in the first direction. Multiple cleave initiation portions (20a to 20g) are arranged alternately to the one side and the other side of first region 15. Specifically, as shown in FIG. 9, multiple first grooves 20b, 20d, 20f are arranged only to the one side of first region 15. Multiple first grooves 20a, 20c, 20e, 20g are arranged only to the other side of first region 15.

Referring to FIG. 9, multiple cleave initiation portions (20a to 20g) are used as initiation points to cleave wafer 11 sequentially, starting from a cleave initiation portion (e.g., cleave initiation portion (20d)) that is relatively difficult to cleave among multiple cleave initiation portions (20a to 20g). Particularly, multiple first grooves 20a to 20g are used as initiation points to cleave wafer 11 sequentially, starting from a first groove (e.g., first groove 20d) whose first depth 22a to 22g is relatively small among multiple first grooves 20a to 20g. Multiple cleave initiation portions (20a to 20g) are arranged alternately to the one side and the other side of first region 15.

Figure 10:
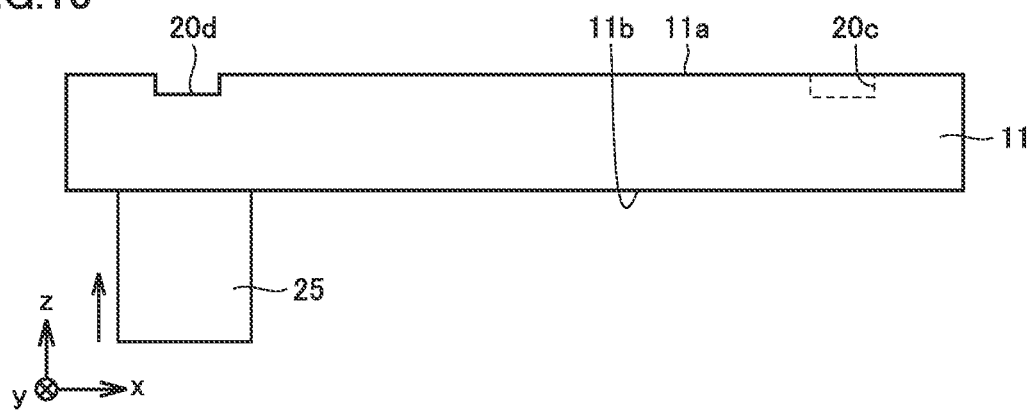
FIG. 10 is a schematic cross-sectional view showing one process included in the method for manufacturing semiconductor devices according to Embodiment 2 of the present invention.
Figure 11:
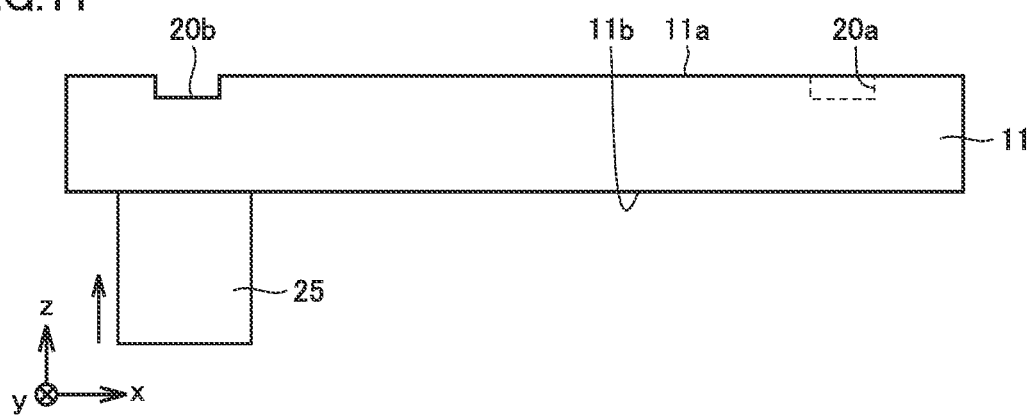
FIG. 11 is a schematic cross-sectional view showing one process included in the method for manufacturing semiconductor devices according to Embodiment 2 of the present invention.

Referring to FIGS. 9 through 11, blade 25 may be used to cleave wafer 11. Using blade 25, in each of multiple division reference lines 71 to 77, a load is applied only to second region 16 located to the side, among the one side and the other side of first region 15, where each of multiple first grooves 20a to 20g is formed. In each of multiple division reference lines 71 to 77, no load is applied to second region 16 located to the side, among the one side and the other side of first region 15, where each of multiple first grooves 20a to 20g is not formed. Due to this, when applying a load, using blade 25, to a first cleave initiation portion (e.g., cleave initiation portion (20d)), which is one of multiple cleave initiation portions (20a to 20g), wafer 11 can be prevented from being cloven using, as an initiation point, a second cleave initiation portion (e.g., cleave initiation portions (20c, 20e)) that is on a second division reference line (e.g., division reference line 73, 75) adjacent to a first division reference line (e.g., division reference line 74) on which a first cleave initiation portion lies.

Specifically, blade 25 is arranged, facing, with a pressure sensitive adhesive sheet (not shown) inbetween, first groove 20d that has the least first depth 22d. First groove 20d is arranged only to the one side of first region 15, and blade 25 is arranged only below the one side of first region 15. Blade 25 is pushed against the pressure sensitive adhesive sheet (not shown) to apply a load to wafer 11 from back surface 11b of wafer 11 toward primary surface 11a. First groove 20d is used as an initiation point to cleave wafer 11 along division reference line 74. First grooves 20c, 20e do not lie on division reference line 73, 75 adjacent to division reference line 74 and to the one side of first region 15. When applying a load, using blade 25, to a portion of wafer 11 which corresponds to first groove 20d, wafer 11 can be prevented from being cloven, using, an initiation point, first groove 20c, 20e on division reference line 73, 75 adjacent to division reference line 74 on which first groove 20d lies.

Next, as shown in FIGS. 9 and 11, blade 25 is arranged, facing, with a pressure sensitive adhesive sheet (not shown) inbetween, first groove 20b having the least first depth 22b after that of first groove 20d. First groove 20b is arranged only to the one side of first region 15, and blade 25 is arranged only below the one side of first region 15. Blade 25 is pushed against the pressure sensitive adhesive sheet (not shown) to apply a load to wafer 11 from back surface 11b of wafer 11 toward wafer 11. First groove 20b is used as an initiation point to cleave wafer 11 along division reference line 72. First grooves 20a, 20c do not lie on division reference lines 71, 73 adjacent to division reference line 72 and to the one side of first region 15. When applying a load, using blade 25, to a portion of wafer 11 which corresponds to first groove 20b, wafer 11 can be prevented from being cloven, using, as initiation points, first grooves 20a, 20c on division reference lines 71, 73 adjacent to division reference line 72 on which first groove 20b lies. Similarly, when applying a load, using blade 25, to a portion of wafer 11 which corresponds to first groove 20f, wafer 11 can be prevented from being cloven, using, as an initiation point, first groove 20e, 20g on division reference line 75, 77 adjacent to division reference line 76 on which first groove 20f lies.

Figure 12:
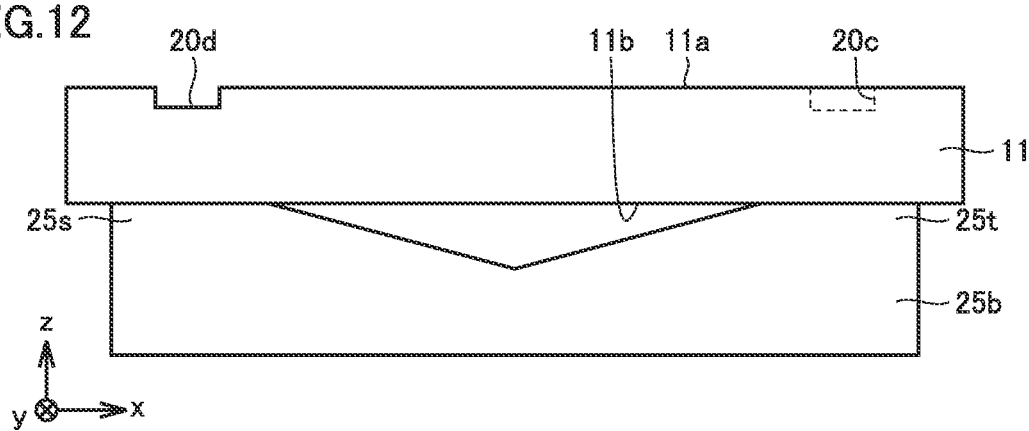
FIG. 12 is a schematic cross-sectional view showing one process included in a method for manufacturing semiconductor devices according to a variation of Embodiment 2 of the present invention.

Referring to FIGS. 9 and 12, blade 25b may be used to cleave wafer 11. Blade 25b has a pair of projections 25s, 25t. Blade 25b is pushed against a pressure sensitive adhesive sheet (not shown) to apply a load to wafer 11 from back surface 11b of wafer 11 toward primary surface 11a. Wafer 11 is cloven from one of the one side and the other side of first region 15 to which each of multiple first grooves 20a to 20g is formed, to the other one of the one side and the other side of first region 15 to which each of multiple first grooves 20a to 20g is not formed.

Specifically, as shown in FIGS. 9 and 12, blade 25b is arranged, facing, with a pressure sensitive adhesive sheet (not shown) inbetween, first groove 20d having a least first depth 22d. First groove 20d is arranged only to the one side of first region 15. Blade 25b is arranged below the one side of first region 15 and below the other side of first region 15. Blade 25b is pushed against the pressure sensitive adhesive sheet (not shown) to apply a load to wafer 11 from back surface 11b of wafer 11 toward primary surface 11a. Projection 25s of blade 25b applies a load to a portion of wafer 11 which corresponds to first groove 20d arranged to the one side of first region 15. First groove 20d is not formed in the portion of wafer 11 to which projection 25t of blade 25b applies a load. Due to this, first groove 20d is used as an initiation point to cleave wafer 11 along division reference line 74, from the one side of first region 15 to which first groove 20d is formed to the other side of first region 15 to which first groove 20d is not formed.

Similarly, blade 25b is used to cleave wafer 11 along each of division reference lines 72, 76, using each of first grooves 20b, 20f as an initiation point, from the one side of first region 15 to which each of first grooves 20b, 20f is formed to the other side of first region 15 to which each of first grooves 20b, 20f is not formed. Blade 25b is used to cleave wafer 11, along each of division reference lines 71, 73, 75, 77, using each of first grooves 20a, 20c, 20e, 20g as an initiation point, from the other side of first region 15 to which each of first grooves 20a, 20c, 20e, 20g is formed to the one side of first region 15 to which each of first grooves 20a, 20c, 20e, 20g is not formed.

As shown in FIGS. 10 and 11, in order to cleave wafer 11 according to the present embodiment by blade 25, blade 25 needs to be moved in the first direction (e.g., x direction) and the second direction (e.g., y direction). In contrast, as shown in FIG. 12, in order to cleave wafer 11 according to the present embodiment by blade 25b, blade 25b may only need to be moved in the second direction (e.g., y direction). Due to this, the manufacturing efficiency for semiconductor devices 12 can be enhanced by using blade 25b to cleave wafer 11 according to the present embodiment.

The method for manufacturing semiconductor devices 12 according to the present embodiment yields the following advantages effects, in addition to the advantages effects of the method for manufacturing semiconductor devices 12 according to Embodiment 1.

In the method for manufacturing semiconductor devices 12 according to the present embodiment, multiple first grooves 20a to 20g are arranged to the one side and the other side of first region 15 in the first direction. Multiple first grooves 20a to 20g are arranged alternately to the one side and the other side of first region 15 in the second direction. Due to this, the number of multiple cleave initiation portions (20a to 20g) which are formed in wafer 11 can decrease. According to the method for manufacturing semiconductor devices 12 of the present embodiment, even when a load such as handling of wafer 11 acts on wafer 11 during the wafer processing, the likelihood of shattering of wafer 11 from multiple cleave initiation portions (20a to 20g) can be reduced.

Furthermore, when a load is applied to a first cleave initiation portion (e.g., cleave initiation portion (20d)), which is one of multiple cleave initiation portions (20a to 20g), to cleave wafer 11, wafer 11 can be prevented from being cloven, using, as initiation points, first cleave initiation portions (e.g., cleave initiation portions (20c, 20e)) on second division reference lines (e.g., division reference line 73, 75) adjacent to first division reference line (e.g., division reference line 74) on which the first cleave initiation portion lies. According to the method for manufacturing semiconductor devices 12 of the present embodiment, the yield for semiconductor devices 12 can be enhanced.

Embodiment 3

Figure 13:
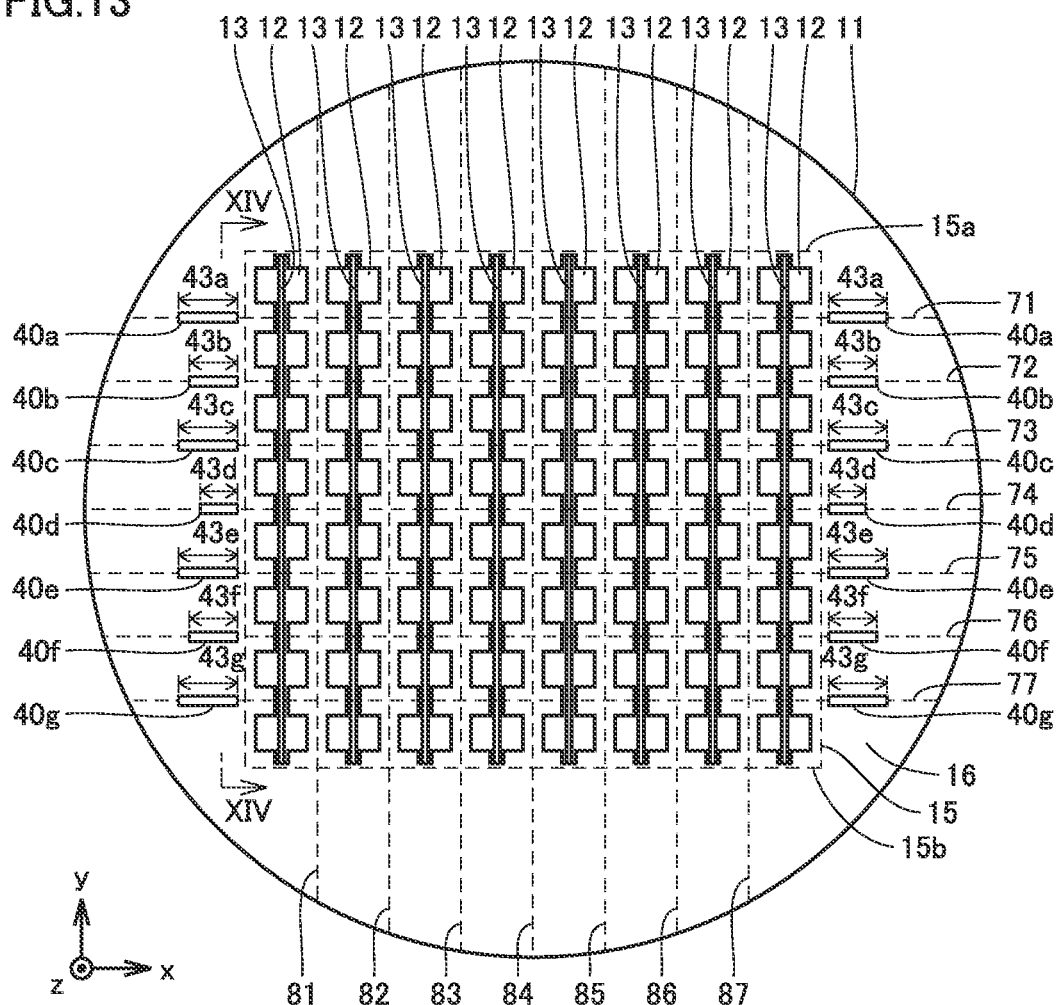
FIG. 13 is a schematic plan view showing one process included in a method for manufacturing semiconductor devices according to Embodiment 3 of the present invention.
Figure 14:
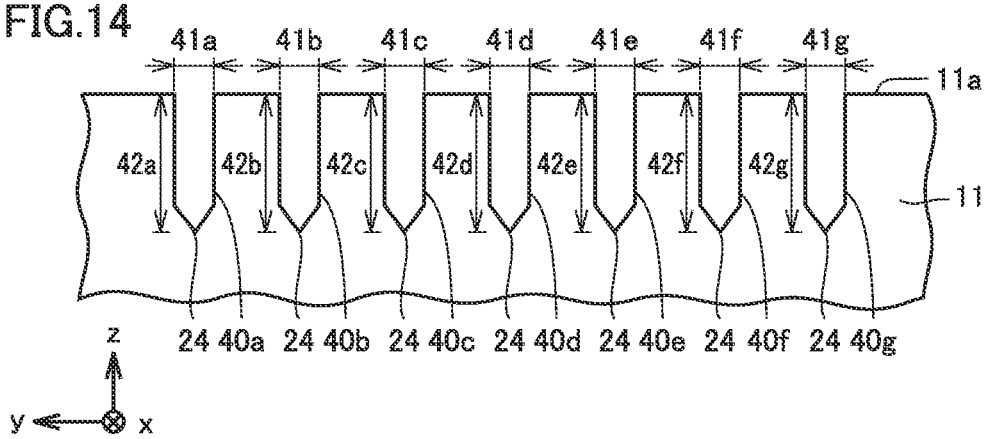
FIG. 14 is an enlarged schematic partial cross-sectional view of one process included in the method for manufacturing semiconductor devices according to Embodiment 3 of the present invention, taken along a section line XIV-XIV shown in FIG. 13.

Referring to FIGS. 13 and 14, a method for manufacturing semiconductor devices 12 according to Embodiment 3 will be described. The method for manufacturing semiconductor devices 12 according to the present embodiment includes the same processes as those included in the method for manufacturing semiconductor devices 12 according to Embodiment 1, except for primarily the differences below.

In the present embodiment, first lengths 43a to 43g of multiple first grooves 40a to 40g are different. First grooves 40a to 40g which have relatively less first lengths 43a to 43g are more difficult to cleave than first grooves 40a to 40g which have relatively great first lengths 43a to 43g.

Specifically, first length 43d of first groove 40d is less than first lengths 43a to 43c, 43e to 43g of respective first grooves 40a to 40c, 40e to 40g. First groove 40d is more difficult to cleave than first grooves 40a to 40c, 40e to 40g. The first lengths 43b, 43f of respective first grooves 40b, 40f are less than first lengths 43a, 43c, 43e, 43g of respective first grooves 40a, 40c, 40e, 40g. First grooves 40b, 40f is easier to cleave than first groove 40d, and more difficult to cleave than first grooves 40a, 40c, 40e, 40g. First grooves 40a, 40c, 40e, 40g are easier to cleave than first grooves 40b, 40f, 40f, respectively. First grooves 40b, 40f may have first lengths 43b, 43d that are an equal length. First grooves 40a, 40c, 40e, 40g may have first lengths 43a, 43c, 43e, 43g that are an equal length.

First depths 42a to 42g of multiple first grooves 40a to 40g may be the same. First widths 41a to 41g of multiple first grooves 40a to 40g may be the same.

Multiple first grooves 40a to 40g arranged to the one side of first region 15 may be apart from first region 15 by the first equidistant. Due to this, the yield for semiconductor devices 12 does not decrease even when first lengths 43a to 43g of multiple first grooves 40a to 40g are different. Multiple first grooves 40a to 40g arranged to the other side of first region 15 respectively may be apart from first region 15 by the second equidistant. Due to this, the yield for semiconductor devices 12 does not decrease even when first lengths 43a to 43g of multiple first grooves 40a to 40g are different. The second equidistant may be equal to the first equidistant. Multiple first grooves 40a to 40g arranged to the one side of first region 15 and multiple first grooves 40a to 40g arranged to the other side of first region 15 are arranged along the first direction.

Multiple first grooves 40a to 40g each may include a side face inclined from primary surface 11a of wafer 11 to bottom portion 24 of each of first grooves 40a to 40g, as shown in FIG. 4. Multiple first grooves 40a to 40g each may include a side face extending substantially perpendicular to primary surface 11a of wafer 11 and a bottom portion connected to the side face and extending substantially in parallel with primary surface 11a of wafer 11, as shown in FIG. 5.

The method for manufacturing semiconductor devices 12 according to the present embodiment yields the same advantages effects as those of the method for manufacturing semiconductor devices 12 according to Embodiment 1.

Embodiment 4

Figure 15:
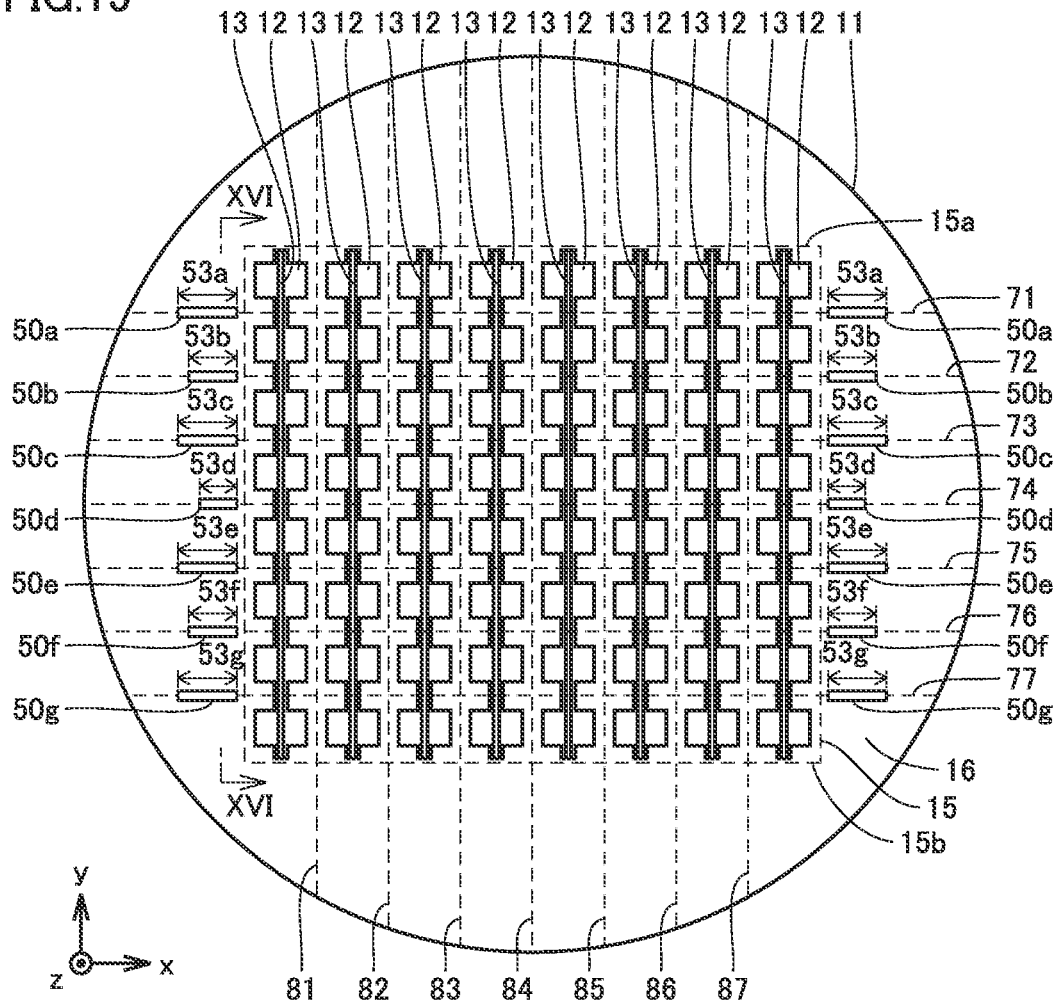
FIG. 15 is a schematic plan view showing one process included in a method for manufacturing semiconductor devices according to Embodiment 4 of the present invention.
Figure 16:
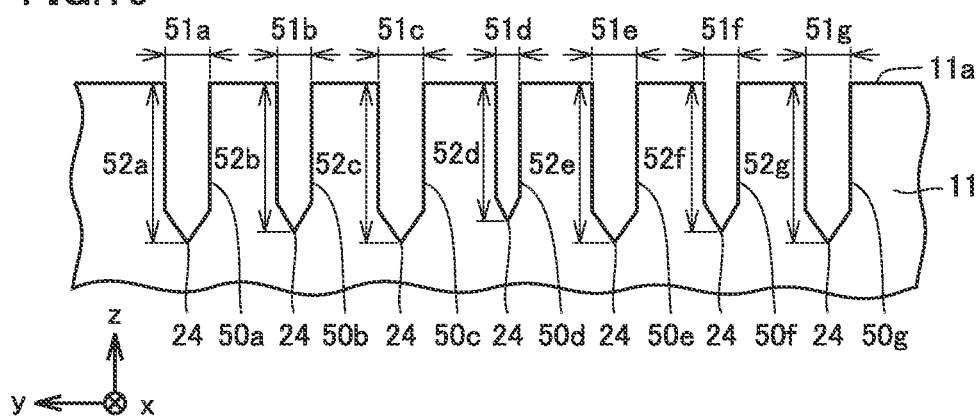
FIG. 16 is an enlarged schematic partial cross-sectional view of one process included in the method for manufacturing semiconductor devices according to Embodiment 4 of the present invention, taken along a section line XVI-XVI shown in FIG. 15.
Figure 17:
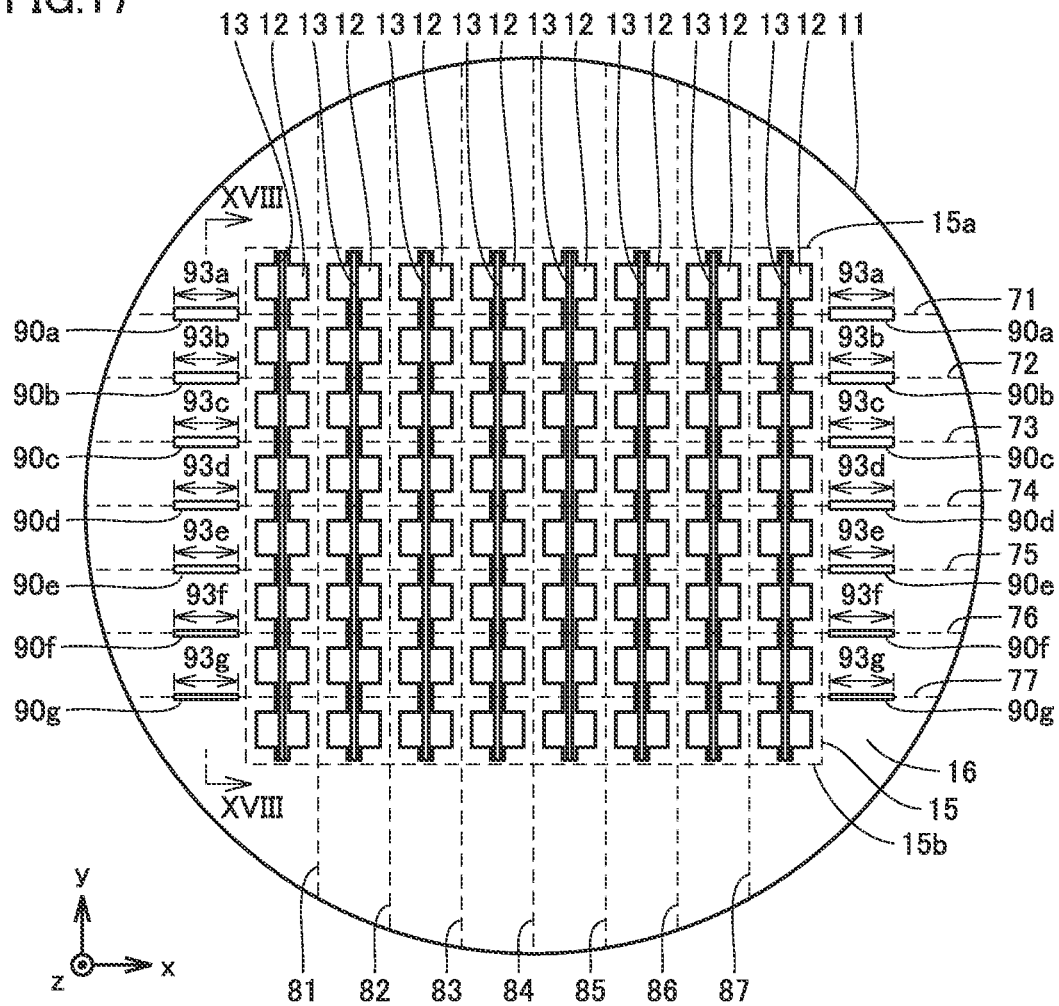
FIG. 17 is a schematic plan view showing one process included in a method for manufacturing semiconductor devices according to Embodiment 5 of the present invention.

Referring to FIGS. 15 and 16, a method for manufacturing semiconductor devices 12 according to Embodiment 4 will be described. The method for manufacturing semiconductor devices 12 according to the present embodiment includes the same processes as those included in the method for manufacturing semiconductor devices 12 according to Embodiment 1, except for primarily the differences below.

In the method for manufacturing semiconductor devices 12 according to the present embodiment, first depths 52a to 52g and first lengths 53a to 53g of multiple first grooves 50a to 50g are respectively different. The first grooves which have relatively less first depths 52a to 52g and first lengths 53a to 53g are more difficult to cleave than first grooves 50a to 50g which have relatively great first depths 52a to 52g and first lengths 53a to 53g.

Specifically, first depth 52d and first length 53d of first groove 50d are less than first depths 52a to 52c, 52e to 52g and first lengths 53a to 53c, 53e to 53g, respectively, of first grooves 50a to 50c, 50e to 50g. First groove 50d is more difficult to cleave than first grooves 50a to 50c, 50e to 50g. First depths 52b, 52f and first lengths 53b, 53f of first grooves 50b, 50f are less than first depths 52a, 52c, 52e, 52g and first lengths 53a, 53c, 53e, 53g, respectively, of first grooves 50a, 50c, 50e, 50g. First grooves 50b, 50f are easier to cleave than first groove 50d, and more difficult to cleave than first grooves 50a, 50c, 50e, 50g. First grooves 50a, 50c, 50e, 50g are easier to cleave than first grooves 50b, 50f. First grooves 50b, 50f may have first depths 52b, 52d that are an equal depth and first lengths 53b, 53d that are an equal length. First grooves 50a, 50c, 50e, 50g may have first depths 52a, 52c, 52e, 52g that are an equal depth and first lengths 53a, 53c, 53e, 53g that are an equal length.

First widths 51a to 51g of multiple first grooves 50a to 50g may be the same. First widths 51a to 51g of multiple first grooves 50a to 50g may be different. Specifically, first width 51d of first groove 50d may be less than first widths 51a to 51c, 51e to 51g of first grooves 50a to 50c, 50e to 50g. First width 51b of first groove 50b and first width 51f of first groove 50f may be less than first widths 51a, 51c, 51e, 51g of first grooves 50a, 50c, 50e, 50g. First grooves 50b, 50f may have first widths 51b, 51d that are an equal width. First grooves 50a, 50c, 50e, 50g may have first widths 51a, 51c, 51e, 51g that are an equal width.

Multiple first grooves 50a to 50g each may include a side face inclined from primary surface 11a of wafer 11 to bottom portion 24 of each of first grooves 50a to 50g, as shown in FIG. 4. Multiple first grooves 50a to 50g each may include a side face extending substantially perpendicular to primary surface 11a of wafer 11 and a bottom portion connected to the side face and extending substantially in parallel with primary surface 11a of wafer 11, as shown in FIG. 5.

The method for manufacturing semiconductor devices 12 according to the present embodiment yields the following advantages effects, in addition to the advantages effects of the method for manufacturing semiconductor devices 12 according to Embodiment 1. In the method for manufacturing semiconductor devices 12 according to the present embodiment, first depths 52a to 52g and first lengths 53a to 53g of multiple first grooves 50a to 50g are different. Due to this, the difference in level of difficulty in being cloven between multiple cleave initiation portions (50a to 50g) according to the present embodiment is greater than the difference in level of difficulty in being cloven between multiple cleave initiation portions (20a to 20g) according to Embodiment 1. According to the method for manufacturing semiconductor devices 12 of the present embodiment, the yield and the manufacturing efficiency for semiconductor devices 12 can be enhanced.

Embodiment 5

Referring to FIGS. 17 through 20, a method for manufacturing semiconductor devices 12 according to Embodiment 5 will be described. The method for manufacturing semiconductor devices 12 according to the present embodiment includes the same processes as those included in the method for manufacturing semiconductor devices 12 according to Embodiment 1, except for primarily the differences below.

At least one of first depths 92a to 92g and first lengths 93a to 93g of multiple first grooves 90a to 90g gradually vary in the second direction. In the present embodiment, first depths 92a to 92g of multiple first grooves 90a to 90g gradually vary in the second direction. Specifically, first depth 92a of first groove 90a is greater than first depth 92b of first groove 90b. First depth 92b of first groove 90b is greater than first depth 92c of first groove 90c. First depth 92c of first groove 90c is greater than first depth 92d of first groove 90d. First depth 92d of first groove 90d is greater than first depth 92e of first groove 90e. First depth 92e of first groove 90e is greater than first depth 92f of first groove 90f. First depth 92f of first groove 90f is greater than first depth 92g of first groove 90g.

First lengths 93a to 93g of multiple first grooves 90a to 90g may be the same. First widths 91a to 91g of multiple first grooves 90a to 90g may be the same. First widths 91a to 91g of multiple first grooves 90a to 90g may be different. Particularly, first widths 91a to 91g of multiple first grooves 90a to 90g may gradually vary in the second direction. Specifically, first width 91a of first groove 90a may be greater than first width 91b of first groove 90b. First width 91b of first groove 90b may be greater than first width 91c of first groove 90c. First width 91c of first groove 90c may be greater than first width 91d of first groove 90d. First width 91d of first groove 90d may be greater than first width 91e of first groove 90e. First width 91e of first groove 90e may be greater than first width 91f of first groove 90f. First width 91f of first groove 90f may be greater than first width 91g of first groove 90g.

Figure 18:
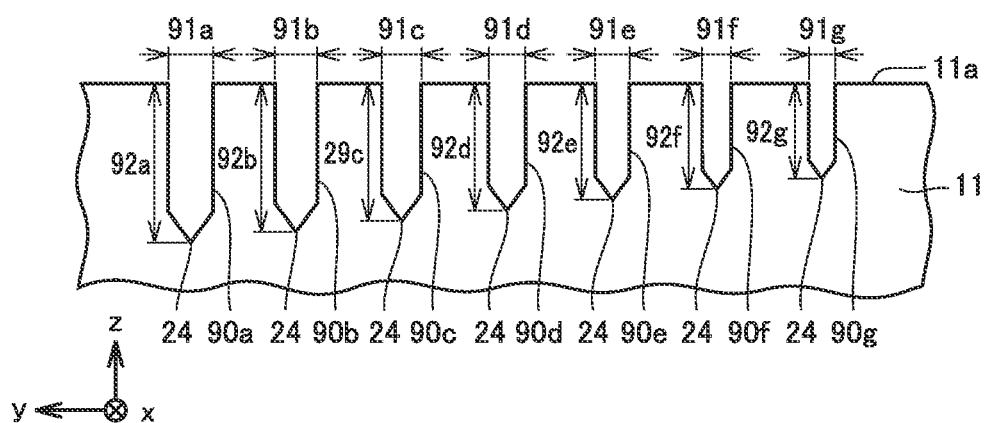
FIG. 18 is an enlarged schematic partial cross-sectional view of one process included in the method for manufacturing semiconductor devices according to Embodiment 5 of the present invention, taken along a section line XVIII-XVIII shown in FIG. 17.
Figure 19:
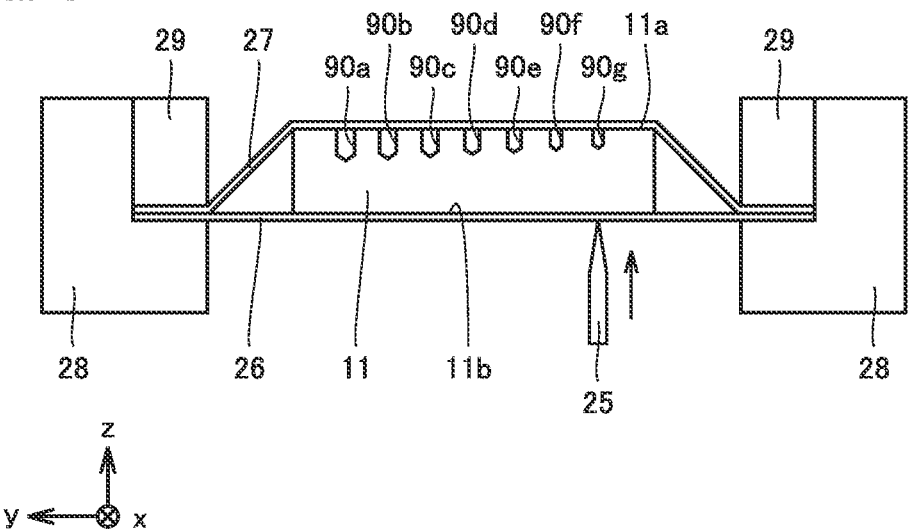
FIG. 19 is a schematic cross-sectional view showing one process included in the method for manufacturing semiconductor devices according to Embodiment 5 of the present invention.
Figure 20:
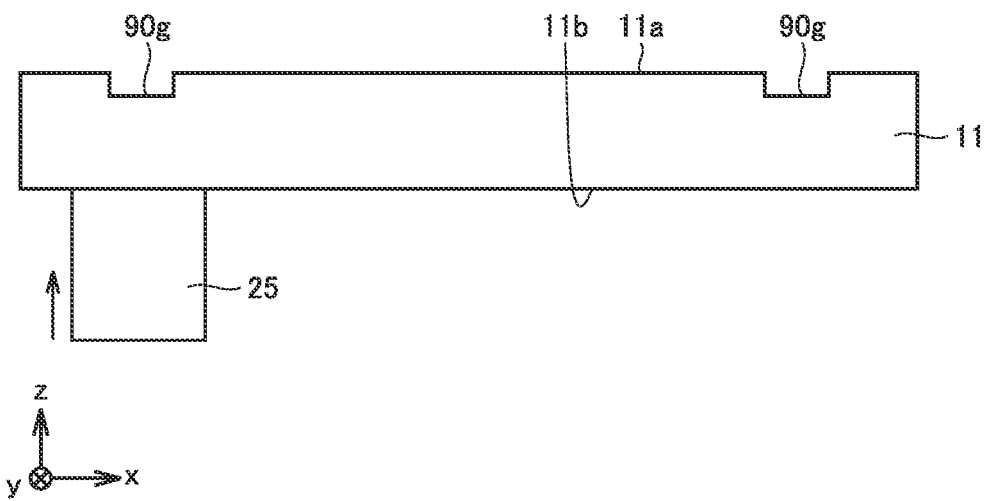
FIG. 20 is a schematic cross-sectional view showing one process included in the method for manufacturing semiconductor devices according to Embodiment 5 of the present invention.

As shown in FIG. 18, multiple first grooves 90a to 90g each may include a V-shaped bottom portion 24 in a cross section orthogonal to the first direction. Each of multiple first grooves 90a to 90g may include a side face extending substantially perpendicular to primary surface 11a of wafer 11 and a V-shaped bottom portion 24 connected to the side face.

Cleaving wafer 11 includes cleaving wafer 11 sequentially, using multiple cleave initiation portions (90a to 90g) as initiation points, starting from a cleave initiation portion (e.g., cleave initiation portion (90g)) at least one of first depth 92a to 92g and first length 93a to 93g of which is relatively small among multiple first grooves 90a to 90g. Specifically, referring to FIGS. 19 and 20, as with Embodiment 1, in the present embodiment, blade 25 may be used to cleave wafer 11. Initially, first groove 90g that is arranged to the one side of first region 15 is used as an initiation point to cleave wafer 11 along division reference line 77. Next, first groove 90f that is arranged to the one side of first region 15 is used as an initiation point to cleave wafer 11 along division reference line 76. Next, first groove 90e that is arranged to the one side of first region 15 is used as an initiation point to cleave wafer 11 along division reference line 75. Next, first groove 90d that is arranged to the one side of first region 15 is used as an initiation point to cleave wafer 11 along division reference line 74. Next, first groove 90c that is arranged to the one side of first region 15 is used as an initiation point to cleave wafer 11 along division reference line 73. Next, first groove 90b that is arranged to the one side of first region 15 is used as an initiation point to cleave wafer 11 along division reference line 72. Finally, first groove 90a that is arranged to the one side of first region 15 is used as an initiation point to cleave wafer 11 along division reference line 71.

Multiple first grooves 90a to 90g each may include a side face inclined from primary surface 11a of wafer 11 to bottom portion 24 of each of first grooves 90a to 90g, as shown in FIG. 4. Multiple first grooves 90a to 90g each may include a side face extending substantially perpendicular to primary surface 11a of wafer 11 and a bottom portion connected to the side face and extending substantially in parallel with primary surface 11a of wafer 11, as shown in FIG. 5.

The method for manufacturing semiconductor devices 12 according to the present embodiment yields the following advantages effects, in addition to the advantages effects of the method for manufacturing semiconductor devices 12 according to Embodiment 1. In the method for manufacturing semiconductor devices 12 according to the present embodiment, at least one of first depths 92a to 92g and first lengths 93a to 93g of multiple first grooves 90a to 90g gradually vary in the second direction. Due to this, when multiple first grooves 90a to 90g are used as initiation points to cleave wafer 11, the distance of movement of blade 25 in the second direction is smallest. According to the method for manufacturing semiconductor devices 12 of the present embodiment, time taken to cleave wafer 11 is shorten, thereby enhancing the manufacturing efficiency for semiconductor devices 12.

Embodiment 6

Figure 21:
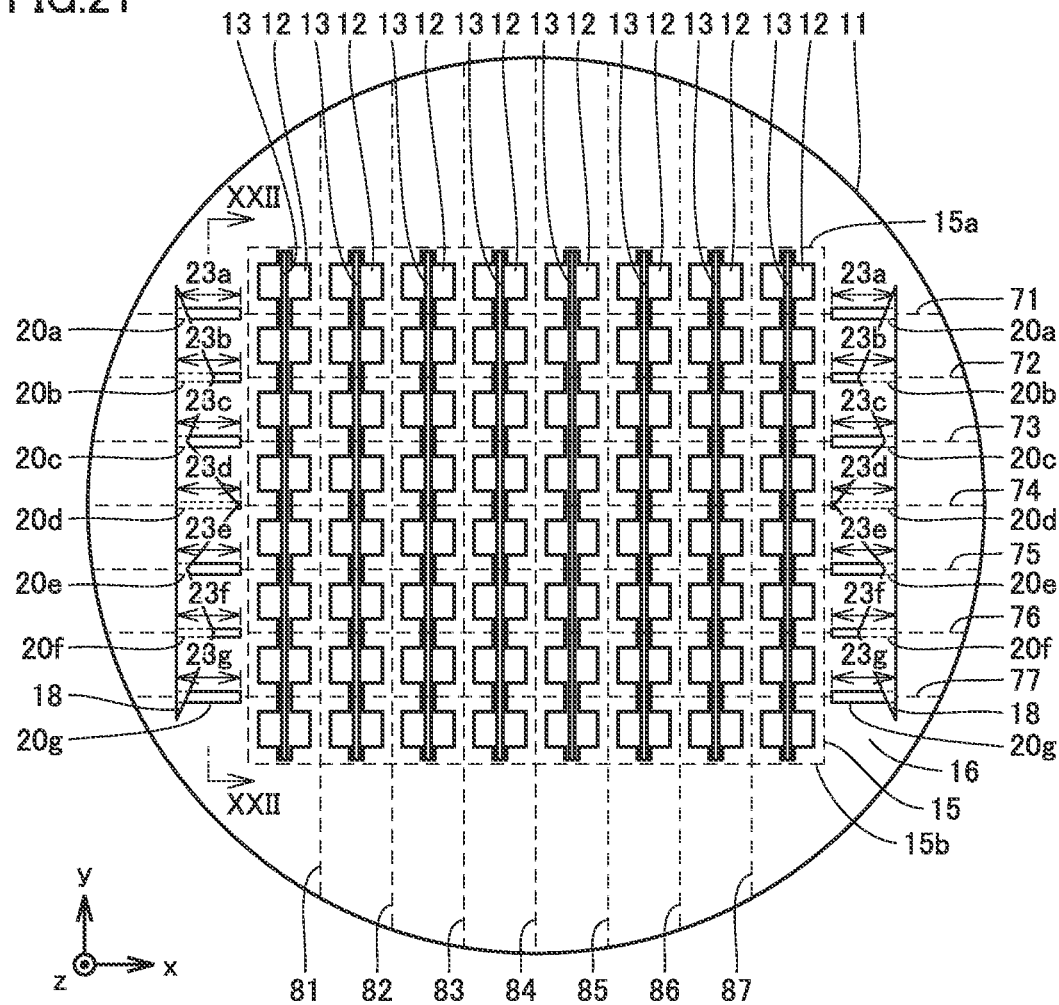
FIG. 21 is a schematic plan view showing one process included in a method for manufacturing semiconductor devices according to Embodiment 6 of the present invention.
Figure 22:
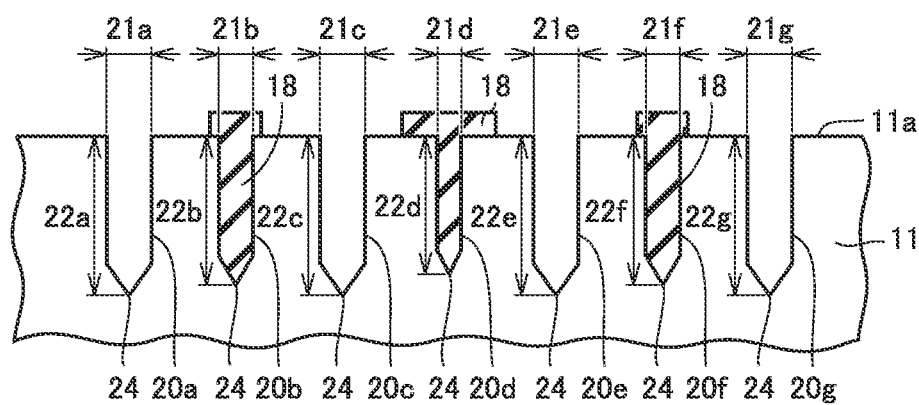
FIG. 22 is an enlarged schematic partial cross-sectional view of one process included in the method for manufacturing semiconductor devices according to Embodiment 6 of the present invention, taken along a section line XXII-XXII shown in FIG. 21.

Referring to FIGS. 21 and 22, a method for manufacturing semiconductor devices 12 according to Embodiment 6 will be described. The method for manufacturing semiconductor devices 12 according to the present embodiment includes the same processes as those included in the method for manufacturing semiconductor devices 12 according to Embodiment 1, except for primarily the differences below.

Forming multiple cleave initiation portions (18, 20a to 20g) further includes filling at least portions of multiple first grooves 20a to 20g with a filling member 18. Filling member 18 may be composed of an organic insulating material, or an inorganic insulating material such as silicon dioxide or silicon nitride. Filling member 18 may be composed of a metal material such as titanium (Ti), platinum (Pt), or gold (Au). Filling member 18 may be a portion of the film formed on primary surface 11a of wafer 11. For example, filling member 18 may be formed by forming the film by a spin coating method, an inkjet method, or a deposition method, and etching the film.

At least one of the second depths and the second lengths of filling members 18 filled within multiple first grooves 20a to 20g are different between multiple cleave initiation portions (18, 20a to 20g). The second depth is the length of filling member 18 in the third direction. The second length is the length of filling member 18 in the first direction. In the present embodiment, the second lengths of filling members 18 within multiple first grooves 20a to 20g are different between multiple cleave initiation portions (18, 20a to 20g). At least one of the second depths and the second lengths of filling members 18 increase with a decrease of at least one of first depths 22a to 22g and first lengths 23a to 23g of multiple first grooves 20a to 20g. In the present embodiment, the second lengths of filling members 18 increase with a decrease of first depths 22a to 22g of multiple first grooves 20a to 20g.

Specifically, first depth 22d of first groove 20d is less than first depths 22a to 22c, 22e to 22g of first grooves 20a to 20c, 20e to 20g and the second length of filling member 18 within first groove 20d is greater than the second lengths of filling members 18 within first grooves 20a to 20c, 20e to 20g. First depths 22b, 22f of first grooves 20b, 20f are less than first depths 22a, 22c, 22e, 22g of first grooves 20a, 20c, 20e, 20g and the second lengths of filling members 18 within first grooves 20b, 20f are greater than the second lengths of filling members 18 within first grooves 20a, 20c, 20e, 20g. First depths 22b, 22f of first grooves 20b, 20f may be an equal depth, and the second length of filling member 18 within first groove 20b and the second length of filling member 18 within first groove 20f may be an equal length. First depths 22a, 22c, 22e, 22g of first grooves 20a, 20c, 20e, 20g may be an equal depth, and the second length of filling member 18 within first groove 20a, the second length of filling member 18 within first groove 20c, the second length of filling member 18 within first groove 20e, and the second length of filling member 18 within first groove 20g may be an equal length.

Instead of multiple first grooves 20a to 20g, multiple first grooves 20a to 20g according to Embodiment 2 may be formed in wafer 11. Instead of multiple first grooves 20a to 20g, multiple first grooves 40a to 40g according to Embodiment 3 may be formed in wafer 11. Instead of multiple first grooves 20a to 20g, multiple first grooves 90a to 90g according to Embodiment 5 may be formed in wafer 11.

The method for manufacturing semiconductor devices 12 according to the present embodiment yields the following advantages effects, in addition to the advantages effects of the method for manufacturing semiconductor devices 12 according to Embodiment 1.

In the method for manufacturing semiconductor devices 12 according to the present embodiment, multiple cleave initiation portions (18, 20a to 20g) are multiple first grooves 20a to 20g at least portions of which are filled with filling member 18. At least one of first depths 22a to 22g and first lengths 23a to 23g of multiple first grooves 20a to 20g are different. First depths 22a to 22g are the lengths of multiple first grooves 20a to 20g in the third direction perpendicular to primary surface 11a. First lengths 23a to 23g are the lengths of multiple first grooves 20a to 20g in the first direction. Forming multiple cleave initiation portions (18, 20a to 20g) further includes filling at least some of multiple first grooves 20a to 20g with filling member 18. At least one of the second depths and the second lengths of filling members 18 within multiple first grooves 20a to 20g are different between multiple cleave initiation portions (18, 20a to 20g). The second depth is the length of filling member 18 in the third direction. The second length is the length of filling member 18 in the first direction. At least one of the second depths and the second lengths of filling members 18 increase with a decrease of at least one of first depths 22a to 22g and first lengths 23a to 23g of multiple first grooves 20a to 20g.

Each of multiple cleave initiation portions (18, 20a to 20g) is easier to cleave with an increase of at least one of first depths 22a to 22g and first lengths 23a to 23g of multiple first grooves 20a to 20g. Furthermore, each of multiple cleave initiation portions (18, 20a to 20g) is easier to cleave with a decrease of at least one of the second depths and the second lengths of filling members 18 within multiple first grooves 20a to 20g. Due to this, wafer 11 can be cloven in a stable manner, even when wafer 11 reduces in size and the bending stress, which acts on cleave initiation portions (18, 20a to 20g) when cleaving wafer 11, reduces with an increase in the number of times the wafer 11 is cloven. According to the method for manufacturing semiconductor devices 12 of the present embodiment, the yield and the manufacturing efficiency for semiconductor devices 12 can be enhanced.

Embodiment 7

Figure 23:
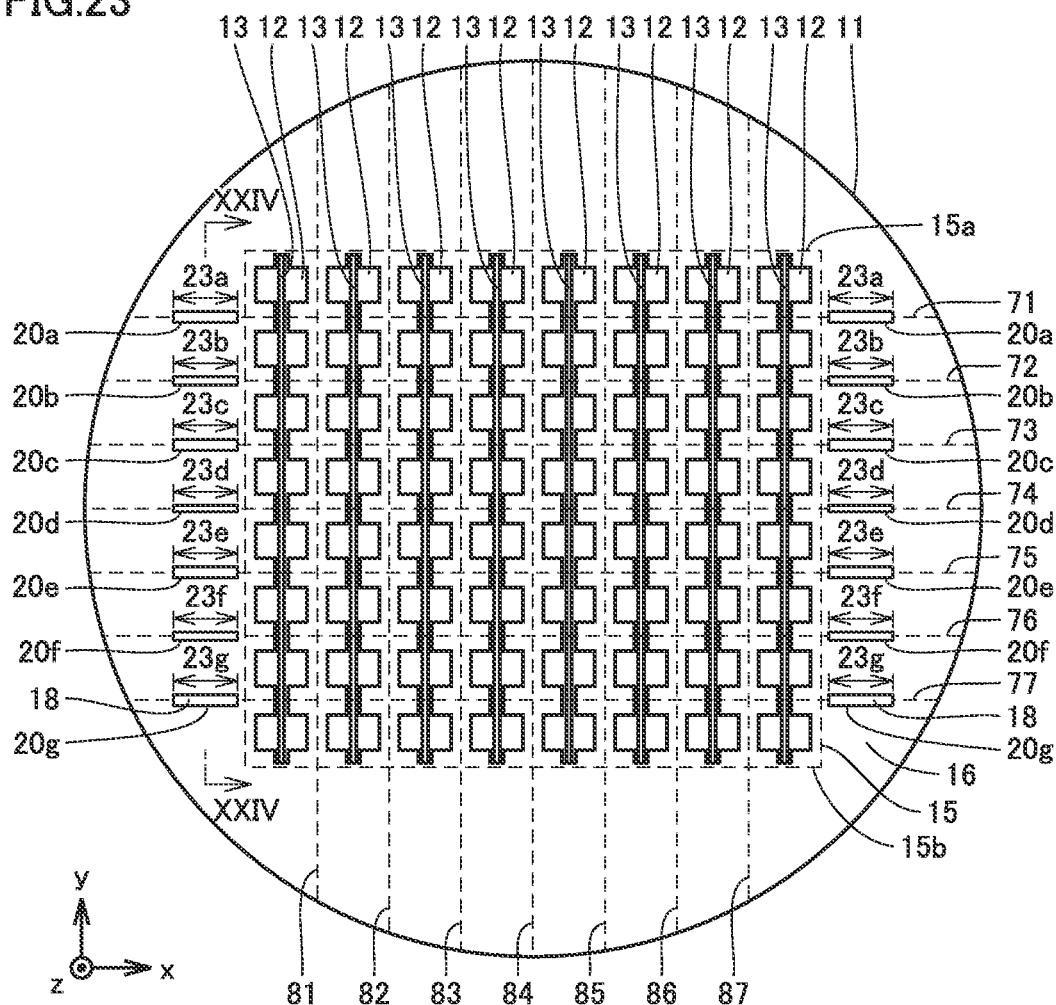
FIG. 23 is a schematic plan view showing one process included in a method for manufacturing semiconductor devices according to Embodiment 7 of the present invention.
Figure 24:
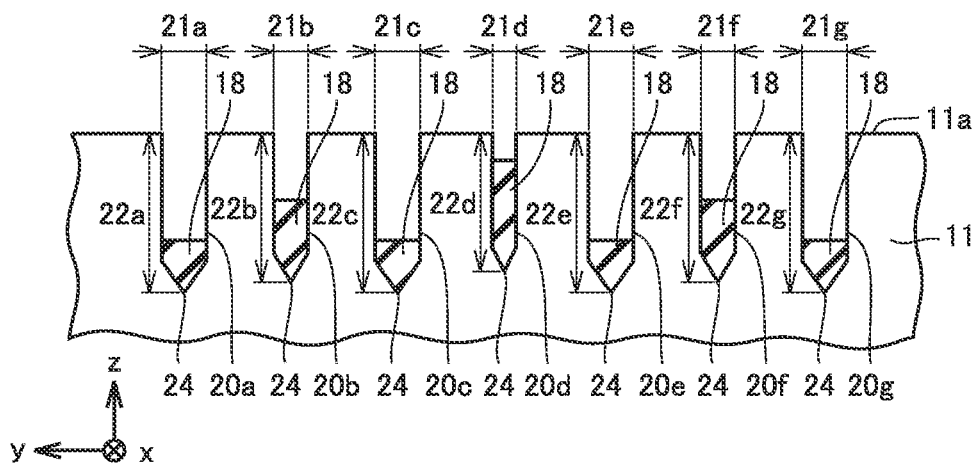
FIG. 24 is an enlarged schematic partial cross-sectional view of one process included in the method for manufacturing semiconductor devices according to Embodiment 7 of the present invention, taken along a section line XXIV-XXIV shown in FIG. 23.

Referring to FIGS. 23 and 24, a method for manufacturing semiconductor devices 12 according to Embodiment 7 will be described. The method for manufacturing semiconductor devices 12 according to the present embodiment includes the same processes as those included in the method for manufacturing semiconductor devices 12 according to Embodiment 6, except for primarily the differences below.

Filling member 18 may be formed only within multiple first grooves 20a to 20g, and may not be formed on primary surface 11a of wafer 11. For example, filling member 18 may be formed, using an inkjet method. For example, filling member 18 may be formed by forming a film by a spin coating method or a deposition method, and etching the film.

At least one of the second depths and the second lengths of filling members 18 within multiple first grooves 20a to 20g are different between multiple cleave initiation portions (18, 20a to 20g). In the present embodiment, the second depths of filling members 18 within multiple first grooves 20a to 20g are different between multiple cleave initiation portions (18, 20a to 20g). At least one of the second depths and the second lengths of filling members 18 decreases with a decrease of at least one of first depths 22a to 22g and first lengths 23a to 23g of multiple first grooves 20a to 20g. In the present embodiment, the second depths of filling members 18 increase with a decrease of first depths 22a to 22g of multiple first grooves 20a to 20g.

Specifically, first depth 22d of first groove 20d is less than first depths 22a to 22c, 22e to 22g of first grooves 20a to 20c, 20e to 20g, and the second depth of filling member 18 within first groove 20d is greater than the second depths of filling members 18 within first grooves 20a to 20c, 20e to 20g. First depths 22b, 22f of first grooves 20b, 20f are less than first depths 22a, 22c, 22e, 22g of first grooves 20a, 20c, 20e, 20g, and the second depths of filling members 18 within first grooves 20b, 20f are greater than the second depths of filling members 18 within first grooves 20a, 20c, 20e, 20g. First depths 22b, 22f of first grooves 20b, 20f may be an equal depth, and the second depth of filling member 18 within first groove 20b and the second depth of filling member 18 within first groove 20f may be an equal depth. First depths 22a, 22c, 22e, 22g of first grooves 20a, 20c, 20e, 20g may be an equal depth, and the second depth of filling member 18 within first groove 20a, the second depth of filling member 18 within first groove 20c, the second depth of filling member 18 within first groove 20*e*, and the second depth of filling member 18 within first groove 20*g* may be an equal depth.

Instead of multiple first grooves 20*a* to 20*g*, multiple first grooves 20*a* to 20*g* according to Embodiment 2 may be formed in wafer 11. Instead of multiple first grooves 20*a* to 20*g*, multiple first grooves 40*a* to 40*g* according to Embodiment 3 may be formed in wafer 11. Instead of multiple first grooves 20*a* to 20*g*, multiple first grooves 90*a* to 90*g* according to Embodiment 5 may be formed in wafer 11.

The method for manufacturing semiconductor devices 12 according to the present embodiment yields the same advantages effects as those of the method for manufacturing semiconductor devices 12 according to Embodiment 6.

Embodiment 8

Figure 25:
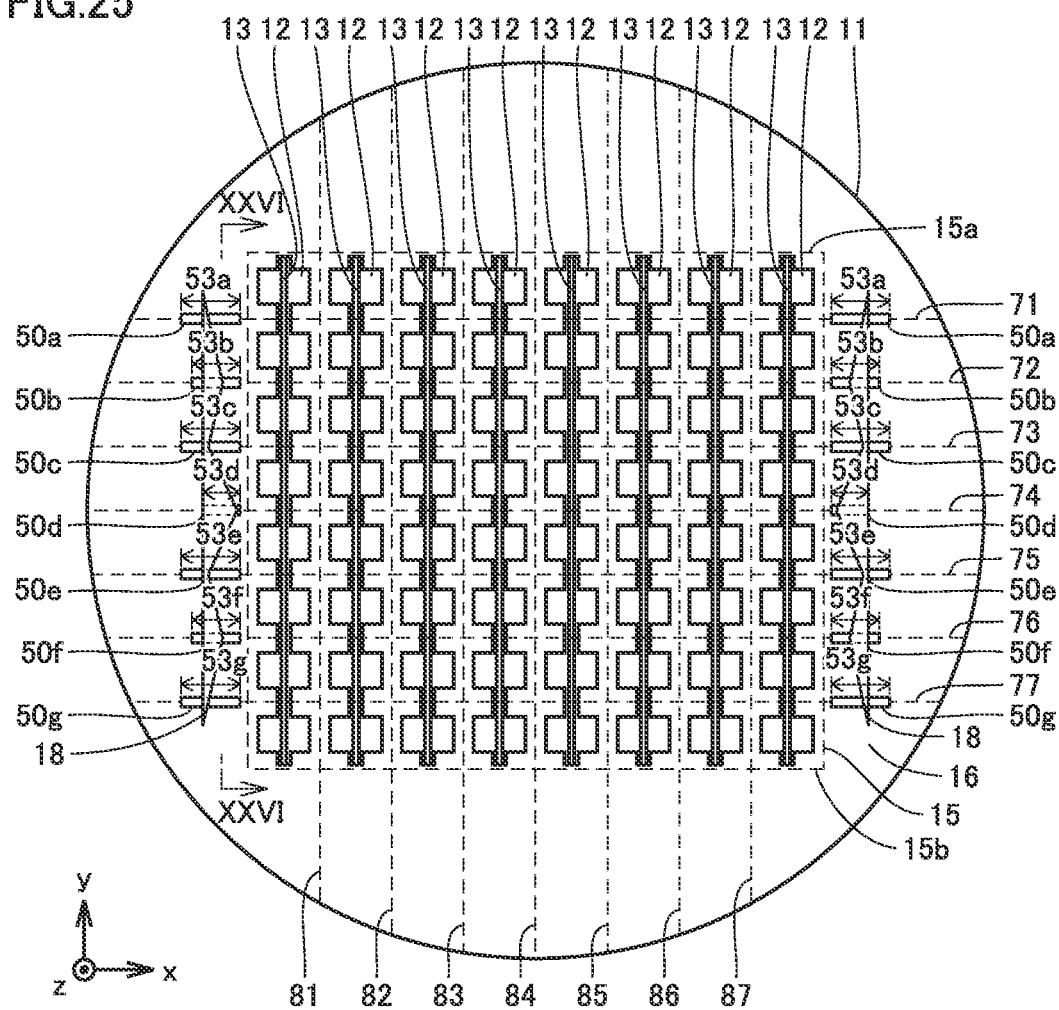
FIG. 25 is a schematic plan view showing one process included in a method for manufacturing semiconductor devices according to Embodiment 8 of the present invention.
Figure 26:
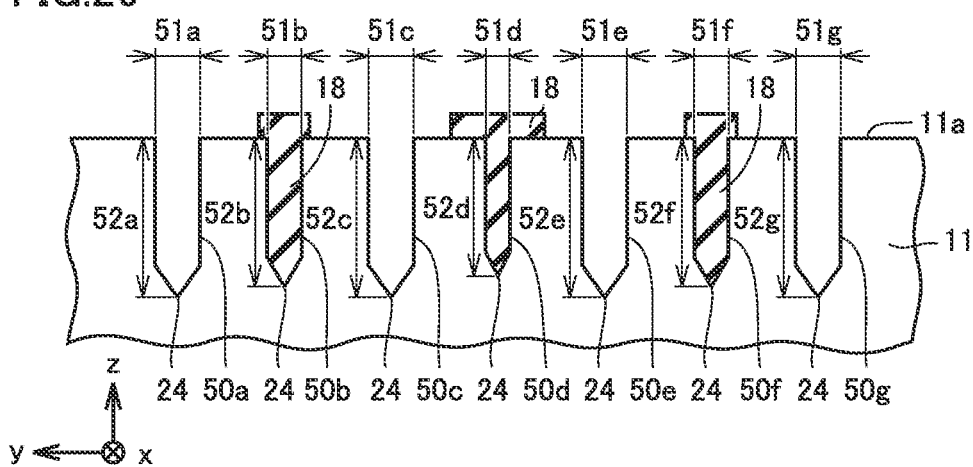
FIG. 26 is an enlarged schematic partial cross-sectional view of one process included in the method for manufacturing semiconductor devices according to Embodiment 8 of the present invention, taken along a section line XXVI-XXVI shown in FIG. 25.

Referring to FIGS. 25 and 26, a method for manufacturing semiconductor devices 12 according to Embodiment 8 will be described. The method for manufacturing semiconductor devices 12 according to the present embodiment includes the same processes as those included in the method for manufacturing semiconductor devices 12 according to Embodiment 6, except for primarily the differences below.

In the method for manufacturing semiconductor devices 12 according to the present embodiment, first depths 52*a* to 52*g* and first lengths 53*a* to 53*g* of multiple first grooves 50*a* to 50*g* are respectively different. Multiple first grooves 50*a* to 50*g* according to the present embodiment may have the same configuration as multiple first grooves 50*a* to 50*g* according to Embodiment 4. As with Embodiment 7, filling member 18 may be formed only within multiple first grooves 50*a* to 50*g*.

The method for manufacturing semiconductor devices 12 according to the present embodiment yields the following advantages effects, in addition to the advantages effects of the method for manufacturing semiconductor devices 12 according to Embodiment 6. In the method for manufacturing semiconductor devices 12 according to the present embodiment, first depths 52*a* to 52*g* and first lengths 53*a* to 53*g* of multiple first grooves 50*a* to 50*g* are respectively different. Due to this, the difference in level of difficulty in being cloven between multiple cleave initiation portions (18, 50*a* to 50*g*) according to the present embodiment is greater than the difference in level of difficulty in being cloven between multiple cleave initiation portions (18, 50*a* to 50*g*) according to Embodiment 6. According to the method for manufacturing semiconductor devices 12 of the present embodiment, the yield and the manufacturing efficiency for semiconductor devices 12 can be enhanced.

Embodiment 9

Referring to FIGS. 27 through 30, a method for manufacturing semiconductor devices 12 according to Embodiment 9 will be described. The method for manufacturing semiconductor devices 12 according to the present embodiment includes the same processes as those included in the method for manufacturing semiconductor devices 12 according to Embodiments 6 and 8, except for primarily the differences below.

Multiple first grooves 60*a* to 60*g* according to the present embodiment have first depths 62*a* to 62*g* that are an equal depth, first lengths 63*a* to 63*g* that are an equal length, and first widths 61*a* to 61*g* that are an equal width. Similarly to multiple cleave initiation portions (18, 20*a* to 20*g*, 50*a* to 50*g*) according to Embodiments 6 and 8, multiple cleave initiation portions (18, 60*a* to 60*g*) according to the present embodiment are multiple first grooves 60*a* to 60*g* at least portions of which are filled with filling member 18. Similarly to Embodiments 6 and 8, forming multiple cleave initiation portions (18, 60*a* to 60*g*) further includes filling at least portions of multiple first grooves 60*a* to 60*g* with filling member 18. At least one of the second depths and the second lengths of filling member 18 within multiple first grooves 60*a* to 60*g* are different between multiple cleave initiation portions (18, 60*a* to 60*g*).

Figure 27:
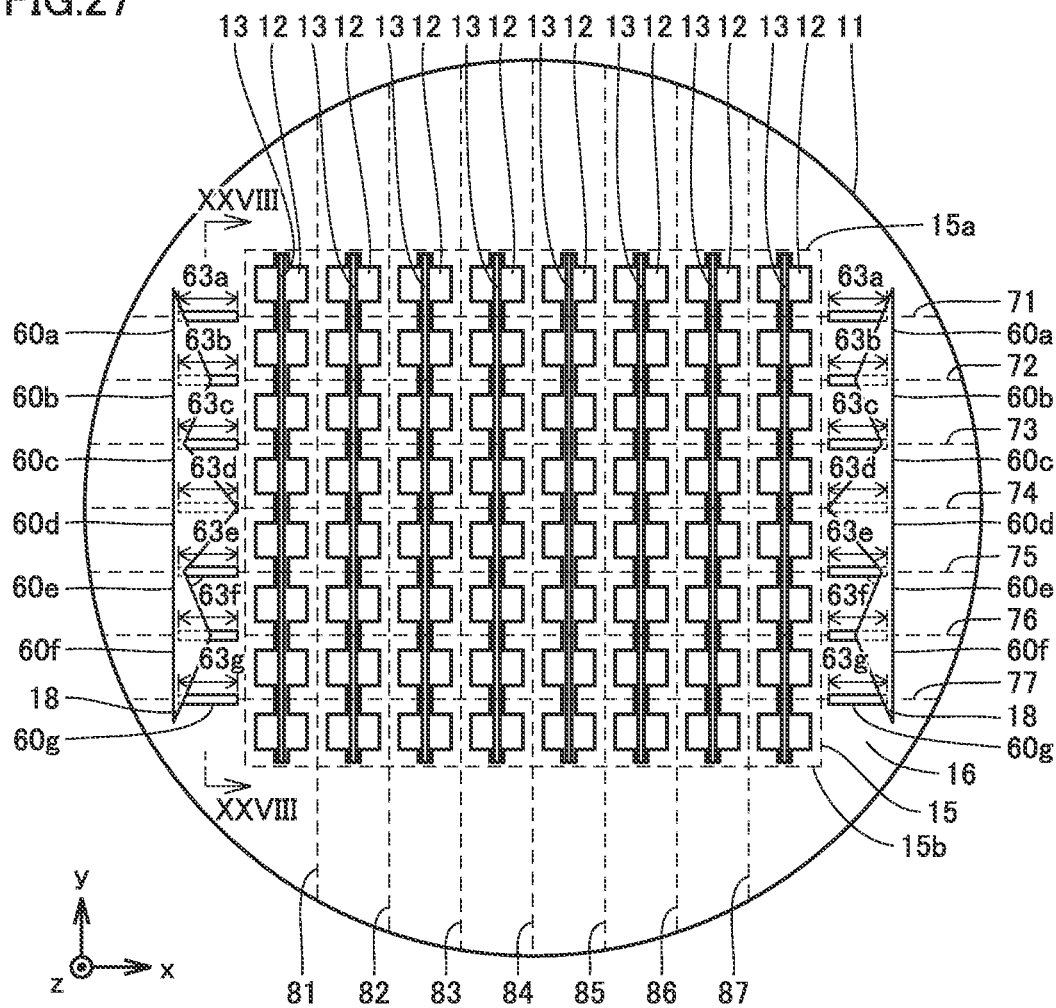
FIG. 27 is a schematic plan view showing one process included in a method for manufacturing semiconductor devices according to Embodiment 9 of the present invention.
Figure 28:
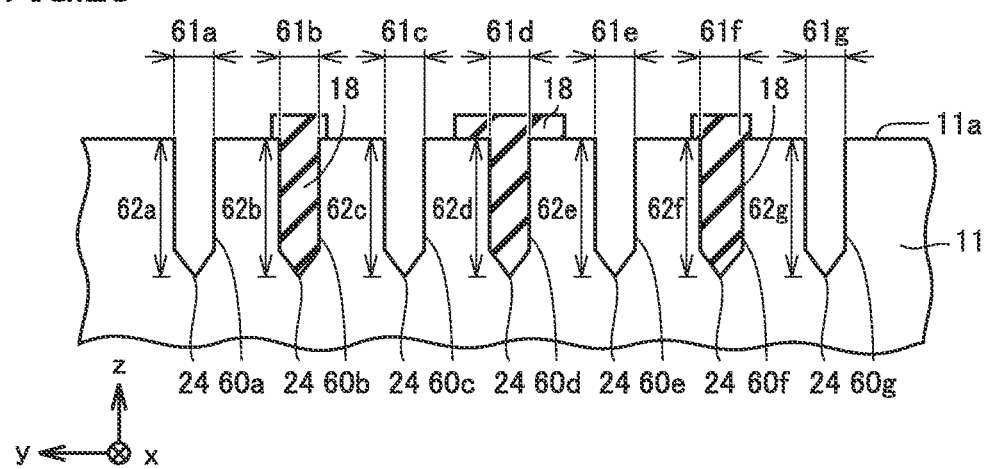
FIG. 28 is an enlarged schematic partial cross-sectional view of one process included in the method for manufacturing semiconductor devices according to Embodiment 9 of the present invention, taken along a section line XXVIII-XXVIII shown in FIG. 28.

As shown in FIGS. 27 and 28, the second lengths of filling members 18 within multiple first grooves 60*a* to 60*g* may be different between multiple cleave initiation portions (18, 60*a* to 60*g*). Specifically, the second length of filling member 18 within first groove 60*d* is greater than the second lengths of filling members 18 within first grooves 60*a* to 60*c*, 60*e* to 60*g*. The second lengths of filling members 18 within first grooves 60*b*, 60*f* are greater than the second lengths of filling members 18 within first grooves 60*a*, 60*c*, 60*e*, 60*g*. The second length of filling member 18 within first groove 60*b* and the second length of filling member 18 within first groove 60*f* may be an equal length. The second length of filling member 18 within first groove 60*a*, the second length of filling member 18 within first groove 60*c*, the second length of filling member 18 within first groove 60*e*, and the second length of filling member 18 within first groove 60*g* may be an equal length.

Figure 29:
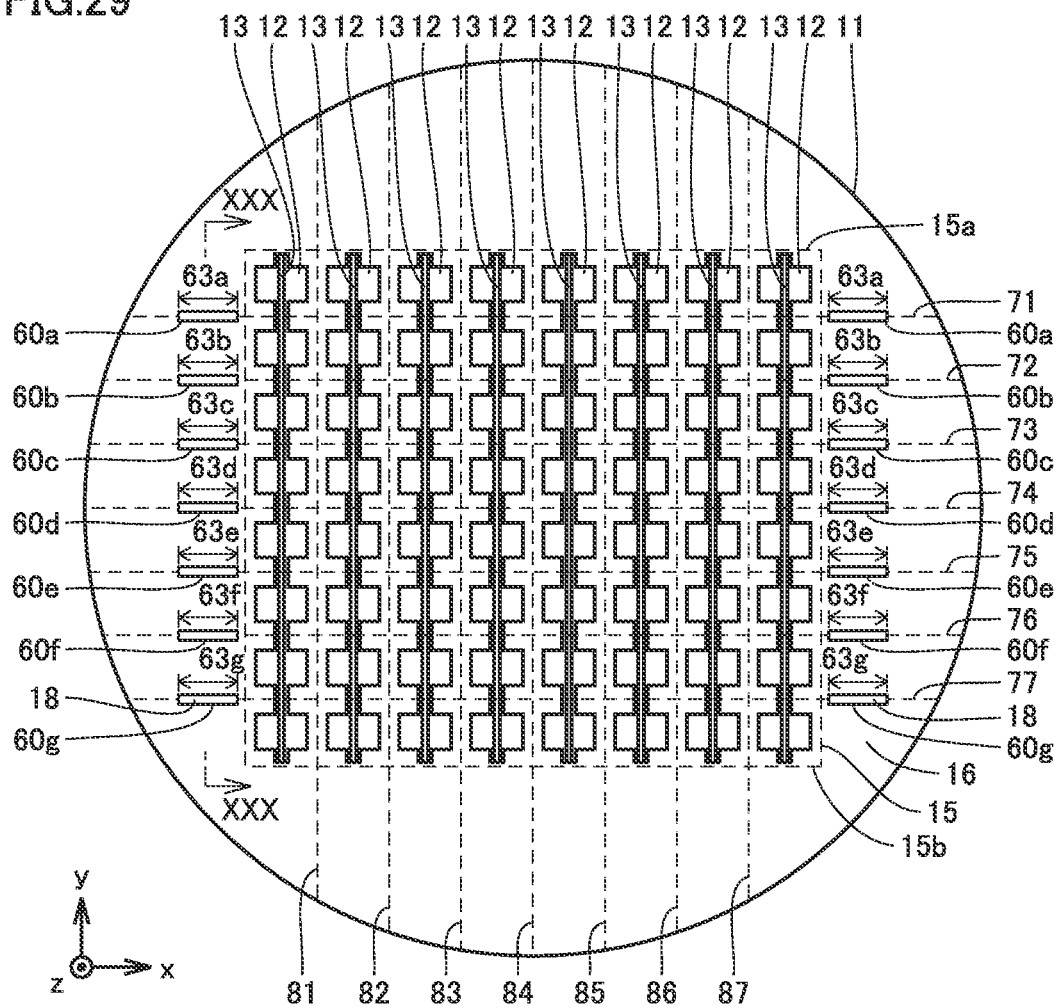
FIG. 29 is a schematic plan view showing one process included in a method for manufacturing semiconductor devices according to a variation of Embodiment 9 of the present invention.
Figure 30:
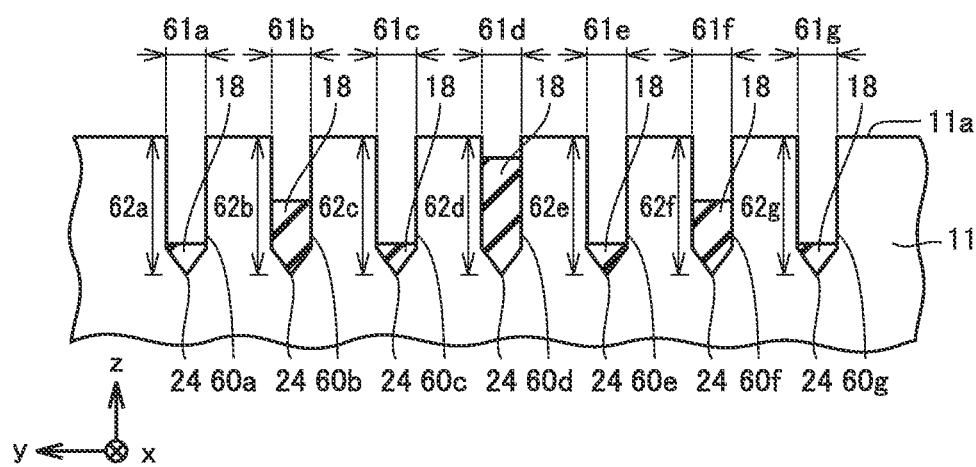
FIG. 30 is an enlarged schematic partial cross-sectional view of one process included in the method for manufacturing semiconductor devices according to the variation of Embodiment 9 of the present invention, taken along a section line XXX-XXX shown in FIG. 29.

As shown in FIGS. 29 and 30, the second depths of filling members 18 within multiple first grooves 60*a* to 60*g* may be different between multiple cleave initiation portions (18, 60*a* to 60*g*). Specifically, the second depth of filling member 18 within first groove 60*d* is greater than the second depths of filling members 18 within first grooves 60*a* to 60*c*, 60*e* to 60*g*. The second depths of filling members 18 within first grooves 60*b*, 60*f* are greater than the second depths of filling members 18 within first grooves 60*a*, 60*c*, 60*e*, 60*g*. The second depth of filling member 18 within first groove 60*b* and the second depth of filling member 18 within first groove 60*f* may be an equal depth. The second depth of filling member 18 within first groove 60*a*, the second depth of filling member 18 within first groove 60*c*, the second depth of filling member 18 within first groove 60*e*, and the second depth of filling member 18 within first groove 60*g* may be an equal depth.

Cleaving wafer 11 includes cleaving wafer 11 sequentially, using multiple cleave initiation portions (18, 60*a* to 60*g*) as initiation points, starting from a cleave initiation portion (e.g., a cleave initiation portion (18, 60*d*)) that is filled with filling member 18 at least one of the second depth and the second length of which is relatively great. Multiple cleave initiation portions (18, 60*a* to 60*g*) are used as initiation points to cleave wafer 11 sequentially, starting from at least one of the second depth and the second length of filling member 18, from a cleave initiation portion (e.g., a cleave initiation portion (18, 60*d*)) filled with filling member 18, at least one of the second depth and the second length of which is greatest, to a cleave initiation portion (e.g., the cleave initiation portions (18, 60*a*, 60*c*, 60*e*, 60*g*)) filled with filling member 18 at least one of the second depth and the second length of which is smallest.

Initially, wafer 11 is cloven in the center portion of wafer 11 in the second direction. Specifically, a cleave initiation portion (18, 60*d*) is used as an initiation point to cleave wafer 11 along division reference line 74. Next, divided wafers 11 are cloven at the center portions of the divided wafers 11 in the second direction. Specifically, a cleave initiation portion (18, 60*b*) and a cleave initiation portion (18, 60*f*) are used as initiation points to cleave wafers 11, having divided along division reference line 74, along division reference line 72 and division reference line 76. Wafer 11 may be cloven along division reference line 72 before cleaving wafer 11 along division reference line 76 or after cleaving wafer 11 along division reference line 76.

Next, divided wafers 11 are further cloven at the center portions of divided wafers 11 in the second direction. Specifically, a cleave initiation portion (18, 60a), a cleave initiation portion (18, 60c), a cleave initiation portion (18, 60e), and a cleave initiation portion (18, 60g) are used as initiation points to cleave wafers 11 along division reference line 71, division reference line 73, division reference line 75, and division reference line 77. Cleaving wafer 11 along division reference line 71, cleaving wafer 11 along division reference line 73, cleaving wafer 11 along division reference line 75, and cleaving wafer 11 along division reference line 77 may be carried out at any order.

Multiple first grooves 60a to 60g each may include a side face inclined from primary surface 11a of wafer 11 to bottom portion 24 of each of first grooves 60a to 60g, as shown in FIG. 4. Multiple first grooves 60a to 60g each may include a side face extending substantially perpendicular to primary surface 11a of wafer 11 and a bottom portion connected to the side face and extending substantially in parallel with primary surface 11a of wafer 11, as shown in FIG. 5. As with Embodiment 7, filling member 18 may be formed only within multiple first grooves 60a to 60g.

The method for manufacturing semiconductor devices 12 according to the present embodiment yields the same advantages effects as those of the method for manufacturing semiconductor devices 12 according to Embodiments 6 and 8, except for primarily the differences below.

In the method for manufacturing semiconductor devices 12 according to the present embodiment, multiple cleave initiation portions (18, 60a to 60g) are multiple first grooves 60a to 60g at least portions of which are filled with filling member 18. Forming multiple cleave initiation portions (18, 60a to 60g) further includes filling at least portions of multiple first grooves 60a to 60g with filling member 18. At least one of the second depths and the second lengths of filling members 18 within multiple first grooves 60a to 60g are different between the cleave initiation portions. The second depth is the length of filling member 18 in the third direction perpendicular to primary surface 11a. The second length is the length of filling member 18 in the first direction. Cleaving wafer 11 includes cleaving wafer 11 sequentially, using multiple cleave initiation portions (18, 60a to 60g) as initiation points, starting from a cleave initiation portion (e.g., cleave initiation portion (18, 60d)) filled with filling member 18 at least one of the second depth and the second length of which is relatively great.

Each of multiple cleave initiation portions (18, 60a to 60g) is easier to cleave with a decrease in at least one of the second depths and the second lengths of filling members 18 within multiple first grooves 60a to 60g. Due to this, wafer 11 can be cloven in a stable manner, even when wafer 11 reduces in size and the bending stress, which acts on the cleave initiation portions (18, 60a to 60g) when cleaving wafer 11, reduces with an increase in the number of times the wafer 11 is cloven. According to the method for manufacturing semiconductor devices 12 of the present embodiment, the yield and the manufacturing efficiency for semiconductor devices 12 can be enhanced.

Embodiment 10

Referring to FIGS. 31 through 37, a method for manufacturing semiconductor devices 12 according to Embodiment 10 will be described. The method for manufacturing semiconductor devices 12 according to the present embodiment includes the same processes as those included in the method for manufacturing semiconductor devices 12 according to Embodiment 1, except for primarily the differences below.

Figure 32:
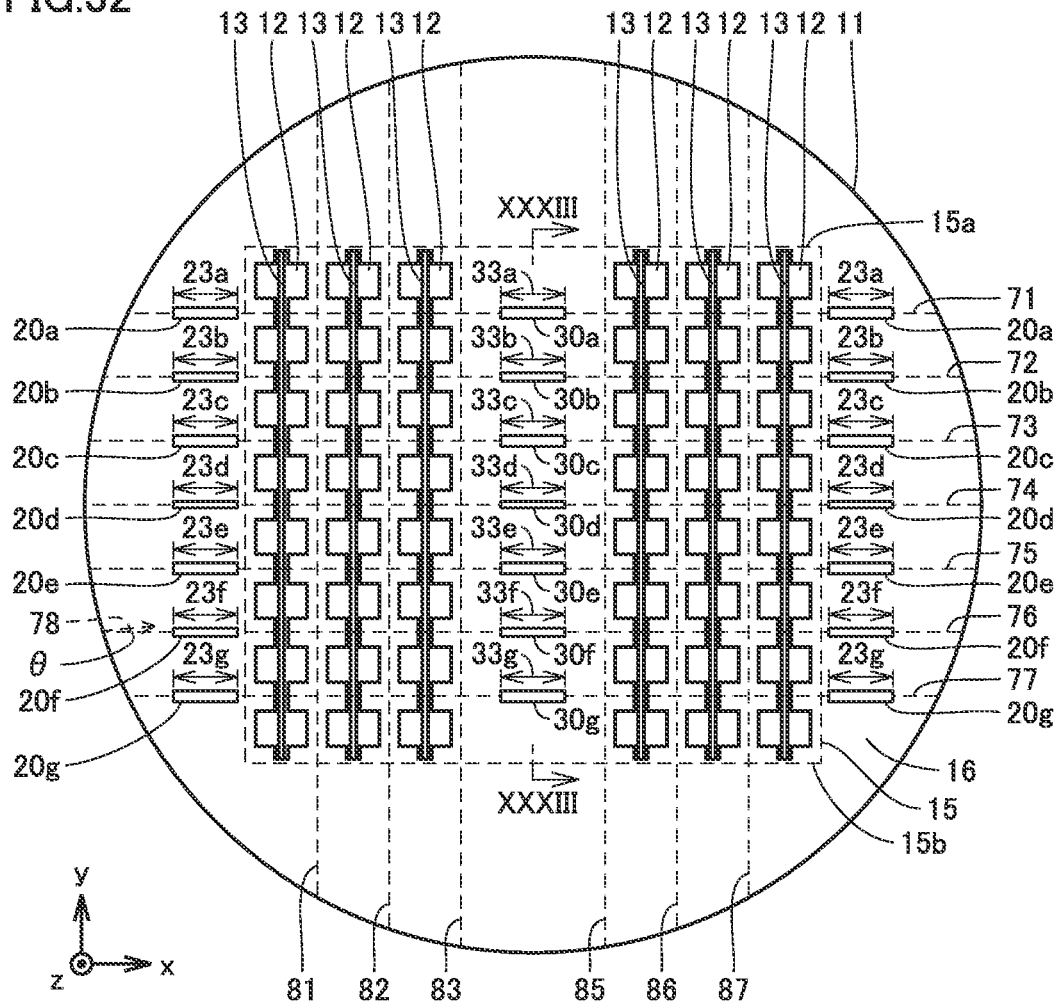
FIG. 32 is a schematic plan view showing one process included in the method for manufacturing semiconductor devices according to Embodiment 10 of the present invention.

Referring to FIG. 32, in the present embodiment, multiple semiconductor devices 12 are formed on primary surface 11a of wafer 11, multiple semiconductor devices 12 being inclined relative to a cleave line 78. Particularly, the direction in which active region 13 extends is inclined relative to cleave line 78, within primary surface 11a of wafer 11. Multiple division reference lines 71 to 77 incline relative to cleave line 78 by azimuthal angle θ, within primary surface 11a of wafer 11. The first direction inclines relative to cleave line 78 by an azimuthal angle θ within primary surface 11a of wafer 11. Herein, cleave line 78 means a line of intersection between a cleave plane of wafer 11 and primary surface 11a of wafer 11. The cleave plane of wafer 11 means a crystallographic plane of wafer 11 which has cleaving properties. Inclinations of multiple semiconductor devices 12, multiple division reference lines 71 to 77, and the first direction relative to cleave line 78 within primary surface 11a of wafer 11 are caused due to, for example, an angular offset of the orientation flat of wafer 11, or misalignment of the pattern for multiple semiconductor devices 12 during photolithography processing.

Figure 31:
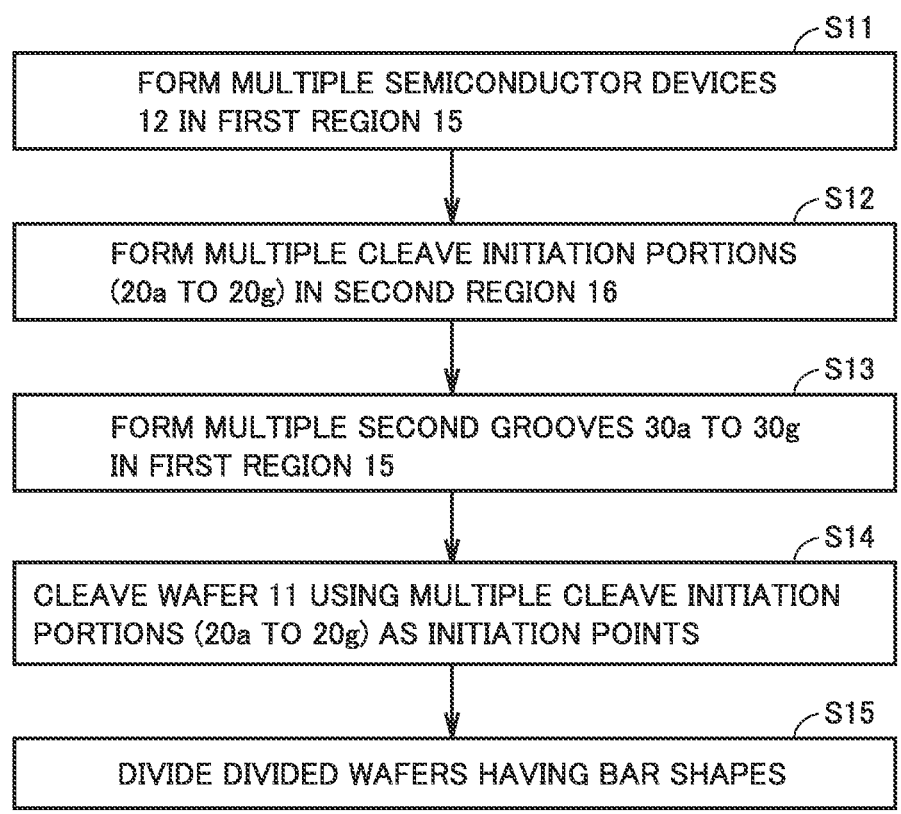
FIG. 31 is a flowchart of a method for manufacturing semiconductor devices according to Embodiment 10 of the present invention.

Referring to FIGS. 31 and 32, the method for manufacturing semiconductor devices 12 according to the present embodiment includes forming (S13) multiple second grooves 30a to 30g in first region 15. Multiple second grooves 30a to 30g are arranged along the second direction. Multiple second grooves 30a to 30g each extend along the first direction. Multiple second grooves 30a to 30g extend along multiple division reference lines 71 to 77, respectively. Multiple second grooves 30a to 30g may be formed in first region 15 by the same process as those of forming multiple first grooves 20a to 20g in second region 16.

Multiple first grooves 20a to 20g and multiple second grooves 30a to 30g are arranged along the first direction. Multiple first grooves 20a to 20g and multiple second grooves 30a to 30g are arranged along the same division reference lines 71 to 77, respectively. Specifically, first groove 20a and second groove 30a are arranged along the first direction and arranged on division reference line 71. First groove 20b and second groove 30b are arranged along the first direction and arranged on division reference line 72. First groove 20c and second groove 30c are arranged along the first direction, and arranged on division reference line 73. First groove 20d and second groove 30d are arranged along the first direction and arranged on division reference line 74. First groove 20e and second groove 30e are arranged along the first direction and arranged on division reference line 75. First groove 20f and second groove 30f are arranged along the first direction and arranged on division reference line 76. First groove 20g and second groove 30g are arranged along the first direction and arranged on division reference line 77. Multiple semiconductor devices 12 are arranged between multiple first grooves 20a to 20g arranged to the one side of first region 15 and multiple second grooves 30a to 30g, and between multiple first grooves 20a to 20g arranged to the other side of first region 15 and multiple second grooves 30a to 30g.

Multiple second grooves 30a to 30g may have the same shape. As shown in FIGS. 32 through 35, multiple second grooves 30a to 30g may have different shapes. Multiple second grooves 30a to 30g may have the same shapes as those of multiple first grooves 20a to 20g, respectively.

Figure 33:
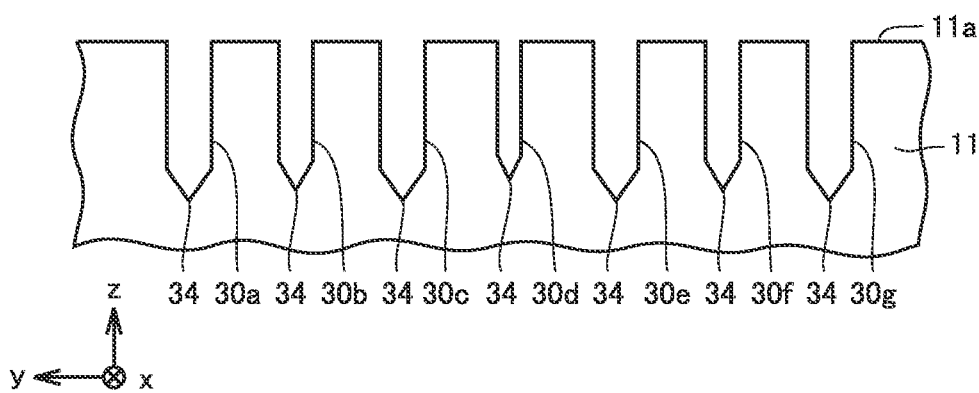
FIG. 33 is an enlarged schematic partial cross-sectional view of one process included in the method for manufacturing semiconductor devices according to Embodiment 10 of the present invention, taken along a section line XXXIII-XXXIII shown in FIG. 32.
Figure 34:
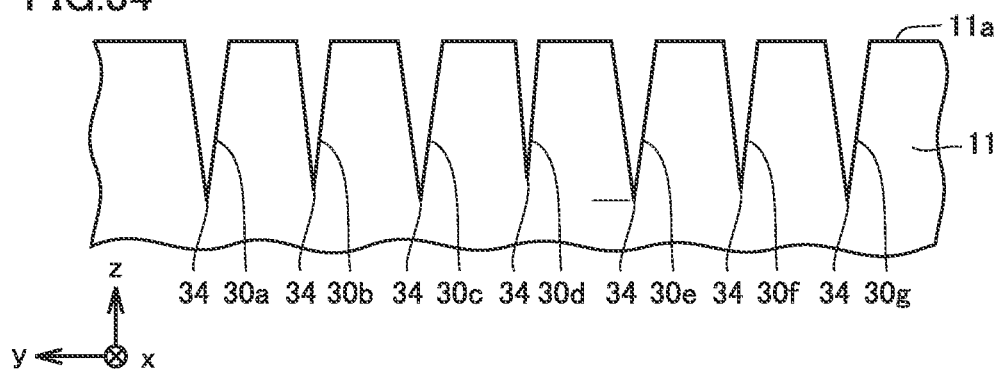
FIG. 34 is an enlarged schematic partial cross-sectional view showing one process included in a method for manufacturing semiconductor devices according to a variation of Embodiment 10 of the present invention.
Figure 35:
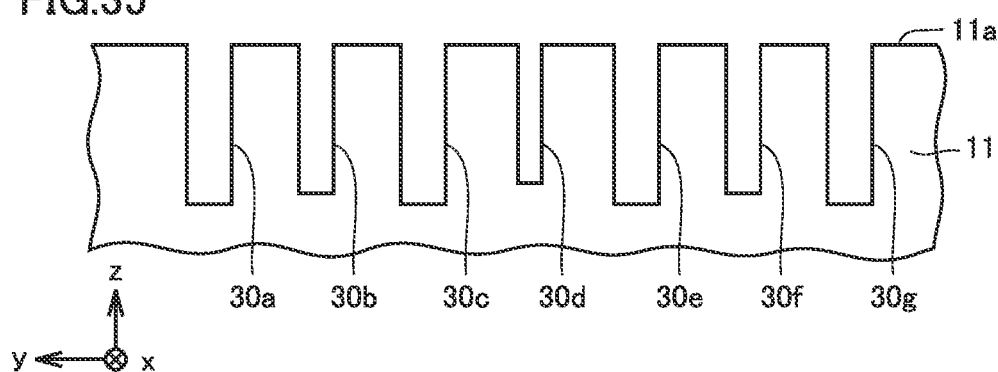
FIG. 35 is an enlarged schematic partial cross-sectional view showing one process included in the method for manufacturing semiconductor devices according to the variation of Embodiment 10 of the present invention.

As shown in FIG. 33, in the present embodiment, multiple second grooves 30a to 30g each may include a V-shaped bottom portion 34 in a cross section orthogonal to the first direction. Each of multiple second grooves 30a to 30g may include a side face extending substantially perpendicular to primary surface 11a of wafer 11 and a V-shaped bottom portion 34 connected to the side face. As shown in FIG. 34, multiple second grooves 30a to 30g each may include V-shaped bottom portion 34, which may include a side face inclined from primary surface 11a of wafer 11 to the bottom portion 34 of each of first grooves. As shown in FIG. 35, multiple second grooves 30a to 30g may have flat bottom portions. Each of multiple second grooves 30a to 30g may include a side face extending substantially perpendicular to primary surface 11a of wafer 11, and a bottom portion connected to the side face and extending substantially in parallel with primary surface 11a of wafer 11.

In the present embodiment, multiple division reference lines 71 to 77 and the first direction are inclined relative to cleave line 78, within primary surface 11a of wafer 11. When cleaving (S14) wafer 11, wafer 11 is cloven along cleave line 78, from each of multiple cleave initiation portions (20a to 20g). Division line 79 extends from a cleave initiation portion, in parallel with cleave line 78. Herein, division line 79 refers to a line of intersection between a division plane and primary surface 11a of wafer 11. Herein, the division plane refers to a plane along which wafer 11 is actually divided when cleaving wafer 11.

Figure 36:
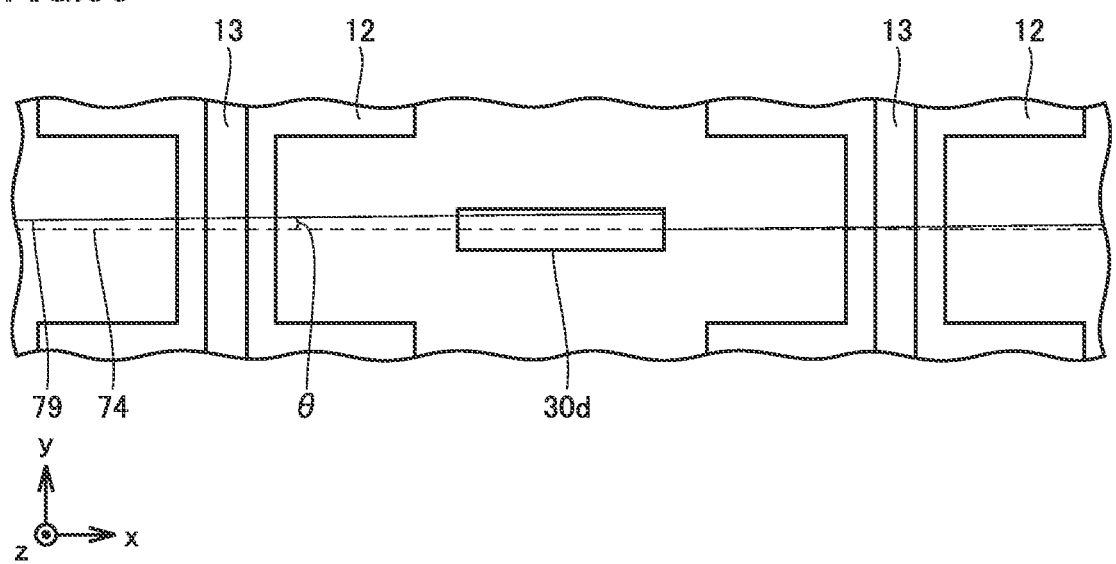
FIG. 36 is an enlarged schematic partial plan view showing one process included in the method for manufacturing semiconductor devices according to Embodiment 10 of the present invention.

Multiple second grooves 30a to 30g are formed in first region 15 of wafer 11. Multiple second grooves 30a to 30g are formed between multiple semiconductor devices 12. While there are no materials of wafer 11 within multiple second grooves 30a to 30g, there are materials of wafer 11 around multiple second grooves 30a to 30g. Due to this, a stress is imposed on the end portion of each of multiple second grooves 30a to 30g. The direction of the stress is orthogonal to division reference lines 71 to 77. As shown in FIG. 36, the stress corrects division line 79, inclined relative to division reference lines 71 to 77 by azimuthal angle θ, so that division line 79 is closer to division reference lines 71 to 77 at the end portions of multiple second grooves 30a to 30g.

As shown in FIGS. 33 and 34, when cleaving wafer 11 having formed there in multiple second grooves 30a to 30g including V-shaped bottom portion 34, the stress is concentrated at the tips of V-shaped bottom portions 34. Wafer 11 is easiest to cleave in the center of each of multiple second grooves 30a to 30g in the second direction. Multiple second grooves 30a to 30g which include V-shaped bottom portion 34 allows division line 79 to be closer to division reference lines 71 to 77 with greater precision.

Figure 37:
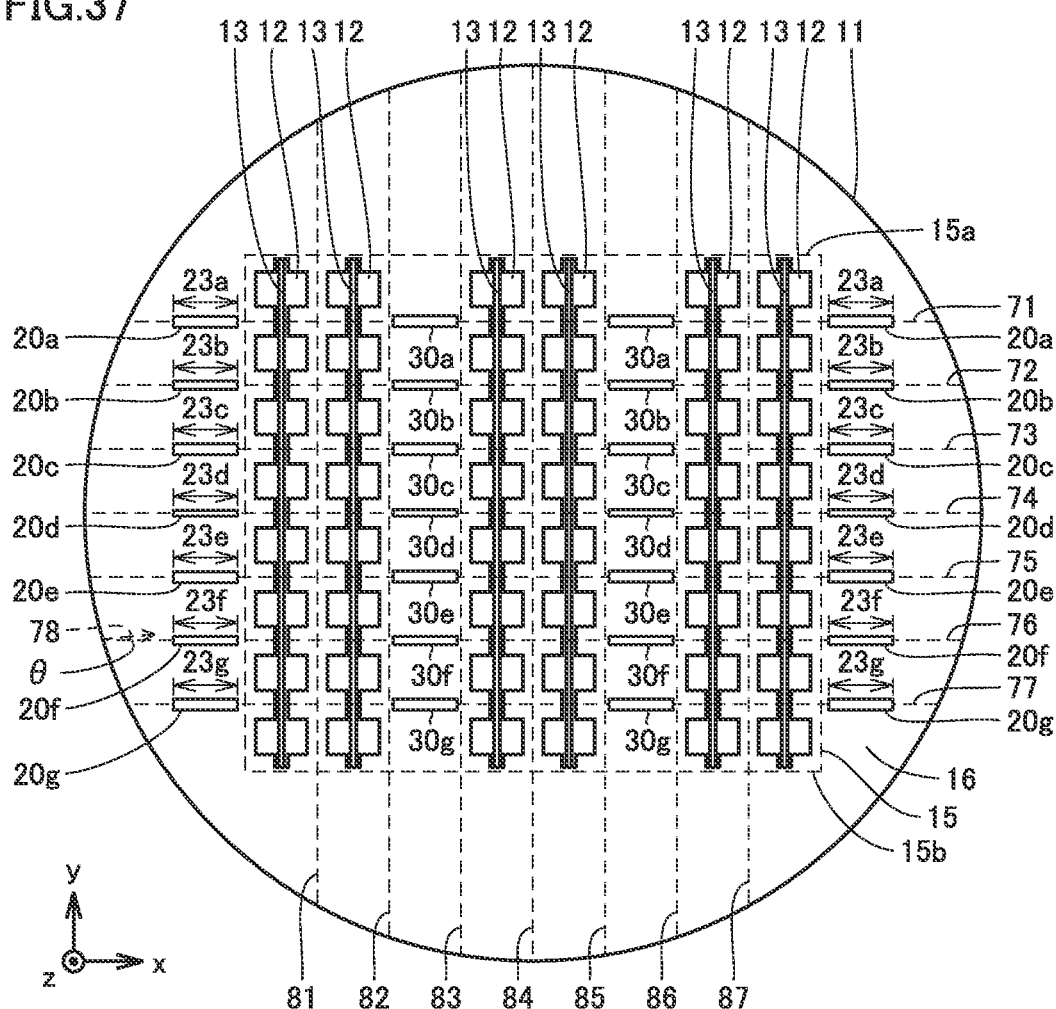
FIG. 37 is a schematic plan view showing one process included in the method for manufacturing semiconductor devices according to the variation of Embodiment 10 of the present invention.

Referring to FIG. 37, multiple second grooves 30a to 30g may be arranged in multiple lines in the first direction. Multiple semiconductor devices 12 are arranged between multiple first grooves 20a to 20g arranged to the one side of first region 15 and multiple second grooves 30a to 30g and between multiple first grooves 20a to 20g arranged to the other side of first region 15 and multiple second grooves 30a to 30g, and between multiple second grooves 30a to 30g. Multiple second grooves 30a to 30g arranged in multiple lines in the first direction can correct division line 79 so as to be closer to division reference lines 71 to 77 at a greater number of times, as compared to multiple second grooves 30a to 30g that are arranged in one line in the first direction. Multiple second grooves 30a to 30g arranged in multiple lines in the first direction can make division line 79 closer to division reference lines 71 to 77 with greater precision.

Second grooves 30a to 30g may be formed outside the first region 15. Instead of multiple cleave initiation portions (20a to 20g), multiple cleave initiation portions (20a to 20g) according to Embodiment 2 may be formed in wafer 11. Instead of multiple cleave initiation portions (20a to 20g), multiple cleave initiation portions (40a to 40g) according to Embodiment 3 may be formed in wafer 11. Instead of multiple cleave initiation portions (20a to 20g), multiple cleave initiation portions (50a to 50g) according to Embodiment 4 may be formed in wafer 11. Instead of multiple cleave initiation portions (20a to 20g), multiple cleave initiation portions (90a to 90g) according to Embodiment 5 may be formed in wafer 11. Instead of multiple cleave initiation portions (20a to 20g), multiple cleave initiation portions (18, 20a to 20g) according to Embodiments 6 and 7 may be formed in wafer 11. Instead of multiple cleave initiation portions (20a to 20g), multiple cleave initiation portions (18, 50a to 50g) according to Embodiment 8 may be formed in wafer 11. Instead of multiple cleave initiation portions (20a to 20g), multiple cleave initiation portions (18, 60a to 60g) according to Embodiment 9 may be formed in wafer 11.

The method for manufacturing semiconductor devices 12 according to the present embodiment yields the following advantages effects, in addition to the advantages effects of the method for manufacturing semiconductor devices 12 according to Embodiment 1.

The method for manufacturing semiconductor devices 12 according to the present embodiment includes forming multiple second grooves 30a to 30g in first region 15. Multiple second grooves 30a to 30g are arranged along the second direction. Multiple second grooves 30a to 30g each extend along the first direction. Multiple first grooves 20a to 20g and multiple second grooves 30a to 30g are arranged along the first direction.

According to the method for manufacturing semiconductor devices 12 of the present embodiment, even if the division reference lines 71 to 77 are inclined relative to cleave line 78 of wafer 11 within primary surface 11a of wafer 11, multiple second grooves 30a to 30g formed in first region 15 can be corrected so that division line 79 is closer to division reference lines 71 to 77. Multiple second grooves 30a to 30g can prevent wafer 11 from being divided at positions that are significantly offset from division reference lines 71 to 77. The method for manufacturing semiconductor devices 12 according to the present embodiment can enhance the yield for semiconductor devices 12.

Embodiment 11

Figure 38:
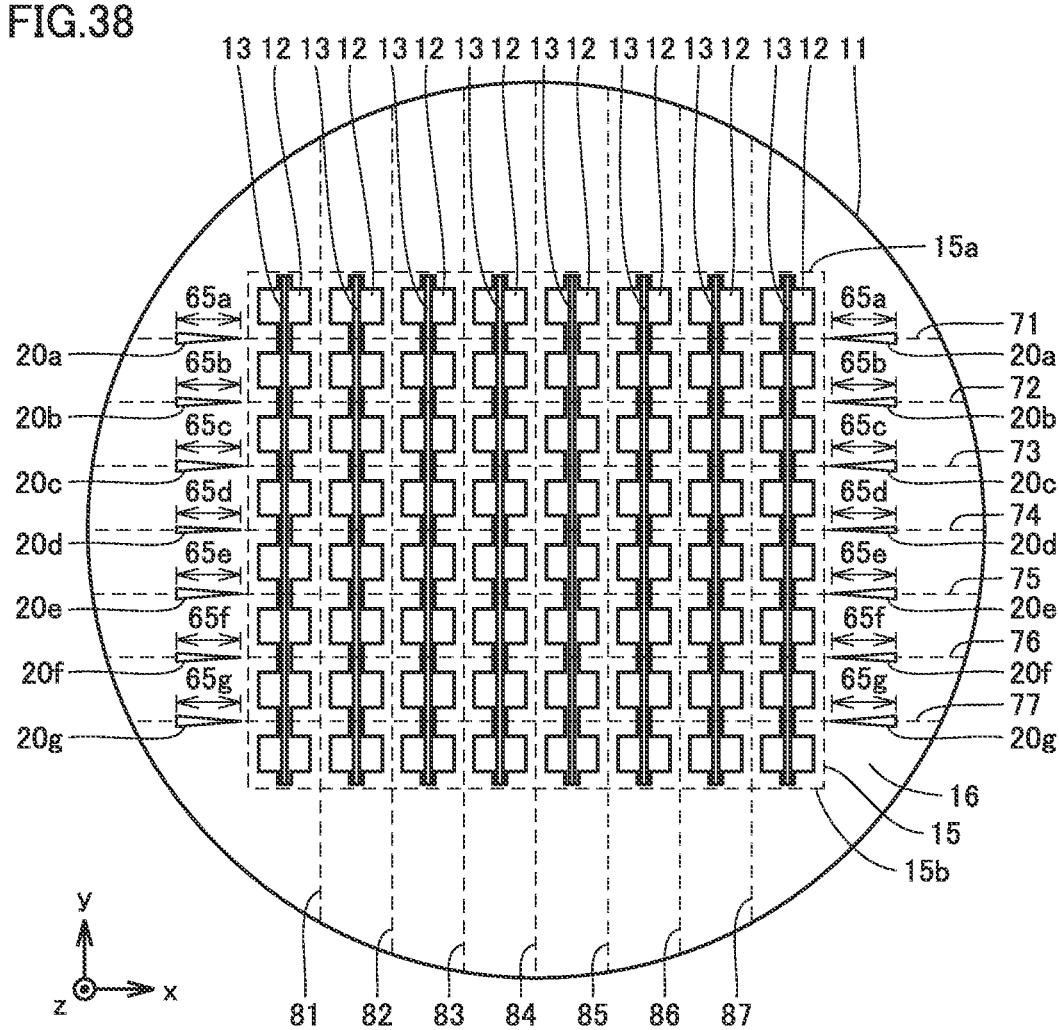
FIG. 38 is an enlarged schematic partial plan view of a method for manufacturing semiconductor devices according to Embodiment 11 of the present invention.

Referring to FIG. 38, a method for manufacturing semiconductor devices 12 according to Embodiment 11 will be described. The method for manufacturing semiconductor devices 12 according to the present embodiment includes the same processes as those included in the method for manufacturing semiconductor devices 12 according to Embodiment 1, except for primarily the differences below.

Multiple cleave initiation portions (multiple first grooves 65a to 65g) according to the present embodiment each include a first end portion, the first end portion including a tapered portion at least to the first region 15 side. Particularly, the tapered portions of multiple cleave initiation portions (multiple first grooves 65a to 65g) may extend from the first end portions of multiple cleave initiation portions (multiple first grooves 65a to 65g) to the first region 15 side to second end portions of multiple cleave initiation portions (multiple first grooves 65a to 65g) to the side opposite the first region 15 side. In a plan vide of primary surface 11a of wafer 11, the tapered portions reduce in thickness toward first region 15.

In the first direction (e.g., x direction), the depths of multiple first grooves 65a to 65g may be constant from the second end portions of multiple cleave initiation portions (multiple first grooves 65a to 65g) to the first end portions of multiple cleave initiation portions (multiple first grooves 65a to 65g). In the first direction (e.g., x direction), the depths of multiple first grooves 65a to 65g may gradually decrease from the second end portions of multiple cleave initiation portions (multiple first grooves 65a to 65g) toward the first end portions of multiple cleave initiation portions (multiple first grooves 65a to 65g). The cone angles of the tapered portions of multiple first grooves 65a to 65g may be acute angles. The cone angle of the tapered portion of first groove 65d, the cone angles of the tapered portions of first grooves 65b, 65f, and the cone angles of the tapered portions of first grooves 65a, 65c, 65e, 65g are different. The cone angles of the tapered portions of first grooves 65b, 65f may be the same, and the cone angles of the tapered portions of first grooves 65a, 65c, 65e, 65g may be the same.

Figure 39:
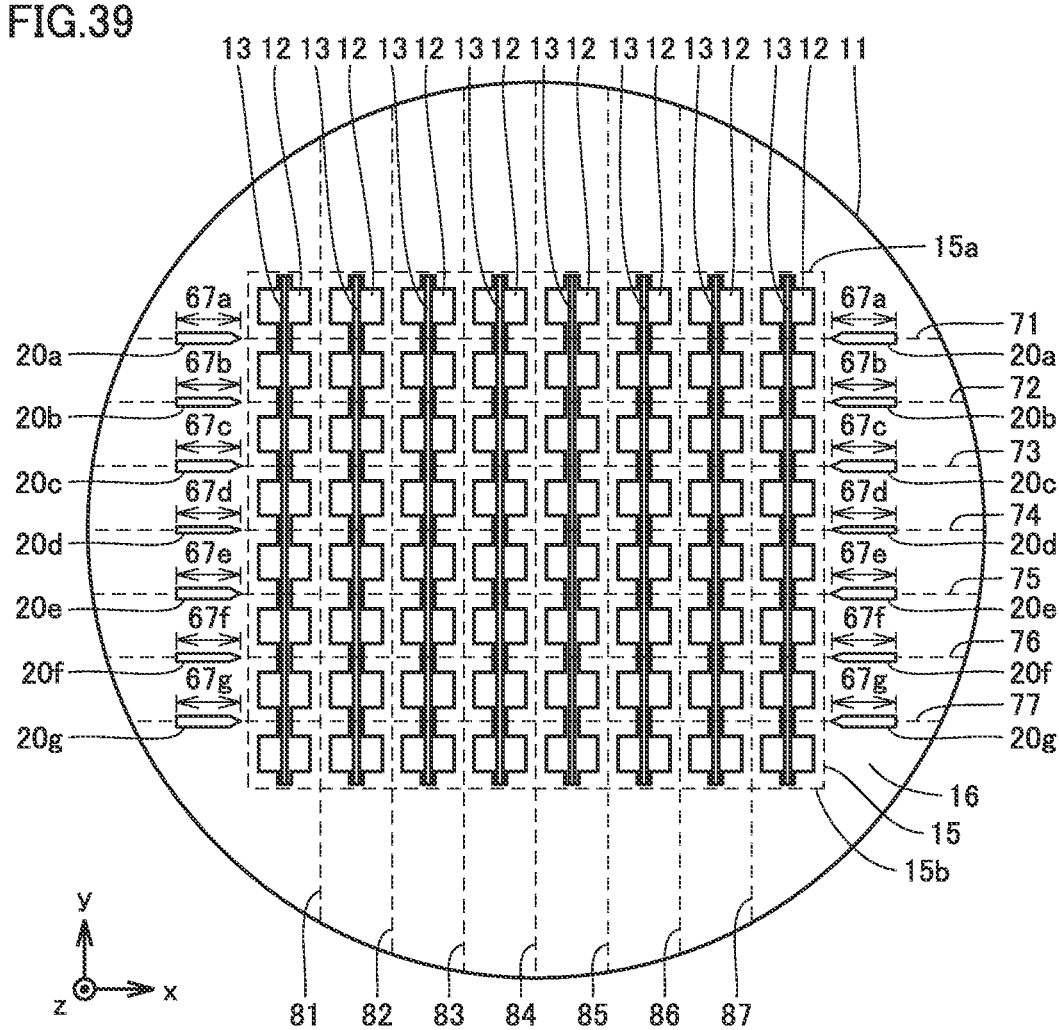
FIG. 39 is a schematic plan view showing one process included in a method for manufacturing semiconductor devices according to a variation of Embodiment 11 of the present invention.

As shown in FIG. 39, in a variation of the present embodiment, the tapered portions of multiple cleave initiation portions (multiple first grooves 67a to 67g) may not extend to the second end portions of multiple cleave initiation portions (multiple first grooves 67a to 67g) to the side opposite the first region 15 side. The tapered portions of multiple cleave initiation portions (multiple first grooves 67a to 67g) may be selectively formed in the first end portions of multiple cleave initiation portions (multiple first grooves 67a to 67g) to the first region 15 side. In a plan view of primary surface 11a of wafer 11, multiple first grooves 67a to 67g according to the variation of the present embodiment have open areas that are greater than those of multiple first grooves 65a to 65g according to the present embodiment. Due to this, the depths of multiple first grooves 67a to 67g and the tendency of wafer 11 to crack in multiple cleave initiation portions (multiple first grooves 67a to 67g) can be more readily controlled when forming multiple first grooves 67a to 67g.

In the first direction (e.g., x direction), the depths of multiple first grooves 67a to 67g may be constant from the second end portions of multiple cleave initiation portions (multiple first grooves 67a to 67g) to the first end portions of multiple cleave initiation portions (multiple first grooves 67a to 67g). In the first direction (e.g., x direction), the depths of the tapered portions of multiple first grooves 67a to 67g may gradually decrease toward the first end portions of multiple cleave initiation portions (multiple first grooves 67a to 67g), and the depths of multiple first grooves 67a to 67g, other than those of the tapered portions, may be constant. The cone angles of the tapered portions of multiple first grooves 67a to 67g may be acute angles. The cone angles of the tapered portions of first groove 67d, the cone angles of the tapered portions of first grooves 67b, 67f, and the cone angles of the tapered portions of first grooves 67a, 67c, 67e, 67g may be the same or different. The cone angles of the tapered portions of first grooves 67b, 67f may be the same and the cone angles of the tapered portions of first grooves 67a, 67c, 67e, 67g may be the same.

The method for manufacturing semiconductor devices 12 according to the present embodiment yields the following advantages effects, in addition to the advantages effects of the method for manufacturing semiconductor devices 12 according to Embodiment 1.

Multiple cleave initiation portions (65a to 65g, 67a to 67g) include first end portions including tapered portions, at least to the first region 15 side. In a plan view of primary surface 11a of wafer 11, the tapered portions reduce in thickness toward first region 15. Due to this, wafer 11 cracks most easily at the tips of the tapered portions. The accuracy of the positions at which wafer 11 is cloven can be enhanced when multiple cleave initiation portions (65a to 65g, 67a to 67g) are used as initiation points to cleave wafer 11. The method for manufacturing semiconductor devices 12 according to the present embodiment can enhance the yield for semiconductor devices 12.

The presently disclosed Embodiments 1 through 11 and the variations thereof should be considered in all aspects illustrative and not restrictive. Unless otherwise indicated herein or clearly contradicted by context, at least two of the presently disclosed Embodiments 1 through 11 and the variations thereof may be combined. The scope of the present invention is indicated by the appended claims, rather than by the above description, and all changes which come within the meaning and range of equivalency of the appended claims are intended to be embraced within their scope.

REFERENCE SIGNS LIST 11 wafer; 11a primary surface; 11b back surface; 12 semiconductor device; 13 active region; 15 first region; 15a one end portion; 15b other end portion; 16 second region; 17 mask; 17a, 17b, 17c, 17d, 17e, 17f, 17g opening; 18 filling member; 20a, 20b, 20c, 20d, 20e, 20f, 20g, 40a, 40b, 40c, 40d, 40e, 40f, 40g, 50a, 50b, 50c, 50d, 50e, 50f, 50g, 60a, 60b, 60c, 60d, 60e, 60f, 60g, 65a, 65b, 65c, 65d, 65e, 65f, 65g, 67a, 67b, 67c, 67d, 67e, 67f, 67g, 90a, 90b, 90c, 90d, 90e, 90f, 90g first groove; 21a, 21b, 21c, 21d, 21e, 21f, 21g, 41a, 41b, 41c, 41d, 41e, 41f, 41g, 51a, 51b, 51c, 51d, 51e, 51f, 51g, 61a, 91a, 91b, 91c, 91d, 91e, 91f, 91g first width; 22a, 22b, 22c, 22d, 22e, 22f, 22g, 42a, 42b, 42c, 42d, 42e, 42f, 42g, 52a, 52b, 52c, 52d, 52e, 52f, 52g, 62a, 92a, 92b, 92c, 92d, 92e, 92f, 92g first depth; 23a, 23b, 23c, 23d, 23e, 23f, 23g, 43a, 53a, 53b, 53c, 53d, 53e, 53f, 53g, 63a, 93a first length; 24, 34 bottom portion; 25, 25b blade; 25s, 25t projection; 26 pressure sensitive adhesive sheet; cover sheet; 28 base; 29 holder; 30a, 30b, 30c, 30d, 30e, 30f, 30g second groove; 71, 72, 73, 74, 75, 76, 77, 81 division reference line; 78 cleave line; and division line.

The invention claimed is:

1. A method for manufacturing semiconductor devices, comprising:

forming a plurality of semiconductor devices in a first region of a primary surface of a wafer, the plurality of semiconductor devices being arranged along a first direction and a second direction intersecting with the first direction;

forming a plurality of cleave initiation portions in a second region of the primary surface, the second region being different from the first region, the plurality of cleave initiation portions being arranged along the second direction, the plurality of cleave initiation portions having different levels of difficulty in being cloven, forming the plurality of cleave initiation portions includes forming a plurality of first grooves by etching portions of the second region, the plurality of first grooves each extending along the first direction; and cleaving the wafer sequentially, using the plurality of cleave initiation portions as initiation points,
wherein:
the plurality of cleave initiation portions include the plurality of first grooves;
at least one of first depths of the plurality of first grooves and first lengths of the plurality of first grooves are different, the first depths being length of the plurality of first grooves in a third direction perpendicular to the primary surface, the first lengths being lengths of the plurality of first grooves in the first direction; and
cleaving the wafer includes cleaving the wafer sequentially, using the plurality of first grooves as initiation points, starting from a first groove, wherein at least one of the first depth and the first length of the first groove is smaller than at least one of the first depth and the first length of another first groove among the plurality of first grooves.

2. The method for manufacturing semiconductor devices according to claim 1, wherein:
at least portions of the plurality of first grooves are filled with a filling member;
forming the plurality of cleave initiation portions further includes filling the at least portions of the plurality of first grooves with the filling member, at least one of second depths and second lengths of the filling member within the plurality of first grooves are different among the plurality of cleave initiation portions, the second depths being lengths of the filling member in the third direction, the second length being lengths of the filling member in the first direction; and
the at least one of the second depths and the second lengths of the filling member increase with a decrease in the at least one of the first depths and the first lengths of the plurality of first grooves.

3. The method for manufacturing semiconductor devices according to claim 1, wherein
cleaving the wafer includes cleaving the wafer at a center portion of the wafer in the second direction to obtain two divided wafers, and cleaving, at least once, the divided wafers at center portions of the divided wafers in the second direction.

4. The method for manufacturing semiconductor devices according to claim 1, wherein
the at least one of the first depths and the first lengths of the plurality of first grooves gradually vary in the second direction.

5. The method for manufacturing semiconductor devices according to claim 1, wherein
the first depths and the first lengths of the plurality of first grooves are respectively different.

6. The method for manufacturing semiconductor devices according to claim 1, wherein:
at least portions of the plurality of first grooves are filled with a filling member;
forming the plurality of cleave initiation portions further includes filling the at least portions of the plurality of first grooves with the filling member, at least one of second depths and second lengths of the filling member within the plurality of first grooves are different among the cleave initiation portions, the second depths being lengths of the filling member in a third direction perpendicular to the primary surface, the second lengths being lengths of the filling member in the first direction; and
cleaving the wafer further includes cleaving the wafer sequentially, using the plurality of cleave initiation portions as initiation points, starting from a cleave initiation portion that is filled with the filling member the at least one of the second depth and the second length of which is greater than at least one of the second depth and the second length of the filling member filling another cleave initiation portion among the plurality of cleave initiation portions.

7. The method for manufacturing semiconductor devices according to claim 1, wherein
the plurality of first grooves each include a V-shaped bottom portion in a cross section orthogonal to the first direction.

8. The method for manufacturing semiconductor devices according to claim 1, wherein
the plurality of cleave initiation portions are arranged to one side and an other side of the first region in the first direction,
the plurality of first grooves arranged to the one side of the first region and the plurality of first grooves arranged to the other side of the first region are arranged along the first direction.

9. The method for manufacturing semiconductor devices according to claim 1, wherein:
the plurality of first grooves are arranged to one side and an other side of the first region in the first direction; and
the plurality of first grooves are arranged alternately to the one side and the other side in the second direction.

10. The method for manufacturing semiconductor devices according to claim 1, comprising forming a plurality of second grooves in the first region, wherein
the plurality of second grooves are arranged along the second direction, the plurality of second grooves each extend along the first direction, and the plurality of first grooves and the plurality of second grooves are arranged along the first direction.

11. The method for manufacturing semiconductor devices according to claim 1, wherein:
the plurality of cleave initiation portions include end portions including tapered portions, the end portions being to a first region side; and
in a plan view of the primary surface of the wafer, the tapered portions reduce in thickness toward the first region.

12. The method for manufacturing semiconductor devices according to claim 1, wherein
the plurality of semiconductor devices are each a semiconductor laser.

13. The method for manufacturing semiconductor devices according to claim 2, wherein
cleaving the wafer includes cleaving the wafer at a center portion of the wafer in the second direction to obtain two divided wafers, and cleaving, at least once, the divided wafers at center portions of the divided wafers in the second direction.

14. The method for manufacturing semiconductor devices according to claim 2, wherein
the at least one of the first depths and the first lengths of the plurality of first grooves gradually vary in the second direction.

* * * * *